United States Patent
Osanai

(10) Patent No.: US 10,110,222 B2
(45) Date of Patent: Oct. 23, 2018

(54) DRIVE UNIT

(71) Applicant: Toyota Jidosha Kabushiki Kaisha, Toyota-shi, Aichi-ken (JP)

(72) Inventor: Yosuke Osanai, Toyota (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/992,542

(22) Filed: May 30, 2018

(65) Prior Publication Data

US 2018/0278248 A1 Sep. 27, 2018

Related U.S. Application Data

(62) Division of application No. 15/451,821, filed on Mar. 7, 2017, now Pat. No. 10,020,803.

(30) Foreign Application Priority Data

Mar. 9, 2016 (JP) .................................. 2016-046211

(51) Int. Cl.
*H03K 17/06* (2006.01)
*H03K 17/687* (2006.01)

(52) U.S. Cl.
CPC ....... *H03K 17/6871* (2013.01); *H03K 17/063* (2013.01)

(58) Field of Classification Search
CPC .................... H03K 17/6871; H03K 17/063
See application file for complete search history.

(56) References Cited

U.S. PATENT DOCUMENTS

| | | |
|---|---|---|
| 6,456,131 B1 | 9/2002 | Tran |
| 2015/0061770 A1 | 3/2015 | Luo et al. |

FOREIGN PATENT DOCUMENTS

| | | |
|---|---|---|
| JP | 2008-078816 A | 4/2008 |
| JP | 2009-111470 A | 5/2009 |
| JP | 2015-046876 A | 3/2015 |

*Primary Examiner* — Jung Kim
(74) *Attorney, Agent, or Firm* — Dinsmore & Shohl LLP

(57) ABSTRACT

A drive unit includes a first transistor, a second transistor, a current source that is connected to a high-potential-side electrode of the first transistor, and delivers constant current, a current control circuit configured to perform control to start of charging of the gates of the first and second transistors using the current source, and a gate charge circuit that charges the gates of the first and second transistors, separately from the current source.

4 Claims, 19 Drawing Sheets

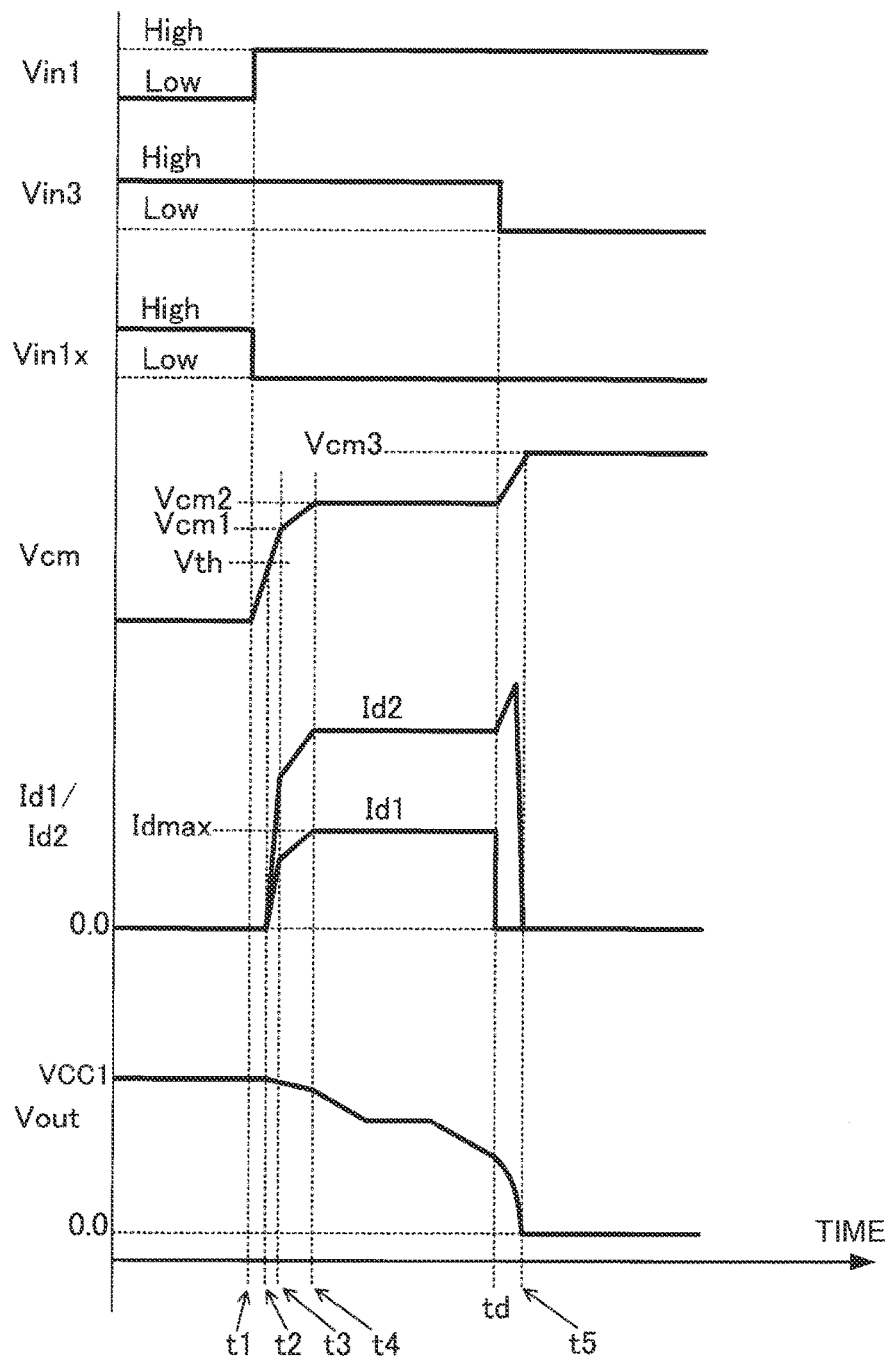

DRIVE UNIT

CROSS-REFERENCE TO RELATED APPLICATIONS

This application is a divisional application of U.S. patent application Ser. No. 15/451,821 filed on Mar. 7, 2017 which claims priority to Japanese Patent Application No. 2016-046211 filed on Mar. 9, 2016, the entire contents of which are hereby incorporated by reference.

BACKGROUND

1. Technical Field

The technology disclosed in this specification relates to a drive unit that drives a transistor to be driven, based on a drive signal.

2. Description of Related Art

An inverter or a voltage converter includes a device for switching a power transistor (transistor to be driven) for electric power conversion, between ON and OFF, based on a drive signal, namely, a drive unit that drives the power transistor.

Japanese Patent Application Publication No. 2009-111470 (JP 2009-111470 A) discloses a drive unit that is able to adjust the speed (which will be called "switching speed") of switching a power transistor between ON and OFF, using a current mirror circuit. The drive unit disclosed in JP 2009-111470 A reduces the switching speed when the power transistor is not required to perform high-speed operation, so as to suppress or reduce switching noise of the power transistor.

The current mirror circuit may be of a type using N-channel transistors, or of a type using P-channel transistors. In the following, a current mirror circuit using N-channel transistors will be described by way of example. In the current mirror circuit, the gates of two transistors having the same gate threshold voltage are connected to each other, and a high-potential-side electrode of one of the transistors is connected to the gate of the transistor. A current source that causes constant current (reference current) to flow is connected to the high-potential-side electrode of the above-indicated one of the transistors. In the following, one of the two transistors of the current mirror circuit, to which the current source is connected, will be called "first transistor", and the other transistor will be called "second transistor".

When the current mirror circuit is used in the drive unit, one of high-potential-side electrode and low-potential-side electrode of the second transistor corresponds to an output terminal of the drive unit, to which the gate of the power transistor is connected. One of a high-voltage terminal that raises the voltage of the gate of the power transistor to the ON voltage, and a low-voltage terminal that reduces the gate voltage to the OFF voltage is connected to the other of the high-potential-side electrode and low-potential-side electrode of the second transistor. When the reference current flows, the first and second transistors of the current mirror circuit are placed in the ON state, and electric current is allowed to flow between the gate of the power transistor and the high-voltage terminal (or the low-voltage terminal). If the reference current is stopped, and the gate voltage of the transistors of the current mirror circuit is lowered, the first and second transistors are placed in the OFF state, and the gate of the power transistors is disconnected from the high-voltage terminal (or the low-voltage terminal).

In the current mirror circuit, electric current proportional to the reference current flows through the second transistor. If the reference current is reduced, the current that flows through the second transistor when it is in the ON state is reduced, and the rate of change of the gate voltage of the power transistor is reduced. As a result, the switching speed of the power transistor is reduced. The drive unit of JP 2009-111470 A adjusts the switching speed of the power transistor (transistor to be driven), by adjusting the magnitude of the reference current.

SUMMARY

In the current mirror circuit of the drive unit, voltage-driven type transistors having small electric power consumption are employed. The voltage-driven type transistor is switched between ON and OFF when its gate is charged and discharged. In the current mirror circuit using N-channel transistors, the gates of the first and second transistors are connected to each other, and a high-potential-side electrode of the first transistor is also connected to the gates. A current source is connected to the high-potential-side electrode of the first transistor, and the gates of the two transistors (the first transistor and the second transistor) are charged with reference current delivered by the current source. In the following description, the first transistor and the second transistor may be simply called "first and second transistors". The drive unit starts charging the gates of the two transistors with the reference current, in response to a trigger (e.g., a pulse edge) of a drive signal. If the reference current is small, the gate charging speed of the transistors of the current mirror circuit is reduced. As a result, it takes a substantial time from receiving of the trigger of the drive signal to switching of the transistors of the current mirror circuit from OFF to ON. In the current mirror circuit using P-channel transistors, the gate and low-potential-side electrode of the first transistor are connected to each other, and discharge current of the gates of both of the first and second transistors is limited to the magnitude of the reference current. If the reference current is small, the gate discharging speed of the transistors of the current mirror circuit is reduced. As a result, it takes a substantial time from receiving of the trigger of the drive signal to switching of the transistors of the current mirror circuit from OFF to ON. Namely, in the drive unit using the current mirror circuit, it takes some response time from the time when a trigger of the drive signal is received to the time when the gate voltage of the transistor to be driven is changed. If the reference current is increased, the response becomes faster, but electric power consumption of the first transistor is increased.

This specification is related to a drive unit using a current mirror circuit, and provides a technology of shortening response time from the time when a trigger of a drive signal is received to the time when a transistor to be driven is driven, without increasing electric power consumption of a first transistor. In the following description, "trigger of drive signal" will be simply referred to as "drive signal". Namely, this specification provides the technology of shortening the response time from receiving of the drive signal to driving of the transistor to be driven.

Initially, a drive unit in which voltage-driven type N-channel transistors are employed in a current mirror circuit will be described. A drive unit of a first aspect disclosed in this specification includes a first transistor that is a voltage-driven type N-channel transistor, and has a high-potential-side electrode and a gate connected to each other, and a second transistor that is a voltage-driven type N-channel transistor, and has the same gate threshold voltage as the first transistor. The second transistor has a gate connected to the gate of the first transistor, and a high-potential-side electrode and a low-potential-side electrode to one of which a gate of the transistor to be driven is connected. The drive unit further includes a current source that is connected to the high-potential-side electrode of the first transistor, and is adapted to deliver constant current, a current control circuit configured to control start of charging of the gates of the first transistor and the second transistor using the current source, in response to the drive signal, and a gate charge circuit that charges the gates of the first transistor and the second transistor, separately from the current source. The gate charge circuit includes configuration of a first charge circuit.

The first charge circuit includes a capacitor having one electrode connected to the gates of the first transistor and the second transistor, a charge terminal that supplies electric power to the other electrode of the capacitor, a discharge terminal that discharges electric power from the other electrode of the capacitor, and a charge switch configured to switch a destination to which the other electrode of the capacitor is connected, from the discharge terminal to the charge terminal, in response to the drive signal. The first charge circuit satisfies a relationship of the following expression (1):

$$V\text{ref} \geq V_{cg} \cdot C_{cg}/(C_{cg}+C_{cm}) \quad (1)$$

where Vref is an output terminal voltage of the current source when the constant current flows between the high-potential-side electrode and the low-potential-side electrode of the first transistor, Ccg is a capacitance of the capacitor, Ccm is a total capacitance of gate capacitances of the first transistor and the second transistor, and Vcg is a voltage of the charge terminal.

A drive unit of a second aspect disclosed in this specification includes a first transistor that is a voltage-driven type N-channel transistor, and has a high-potential-side electrode and a gate connected to each other, and a second transistor that is a voltage-driven type N-channel transistor, and has the same gate threshold voltage as the first transistor. The second transistor has a gate connected to the gate of the first transistor, and a high-potential-side electrode and a low-potential-side electrode to one of which a gate of the transistor to be driven is connected. The drive unit further includes a current source that is connected to the high-potential-side electrode of the first transistor, and is adapted to deliver constant current, a current control circuit configured to control start of charging of the gates of the first transistor and the second transistor using the current source, in response to the drive signal, and a gate charge circuit that charges the gates of the first transistor and the second transistor, separately from the current source. The gate charge circuit includes configuration of a second charge circuit.

The second charge circuit includes a charge terminal that supplies electric power to the gates of the first transistor and the second transistor, a diode having an anode connected to the charge terminal, and a cathode connected to the gates of the first transistor and the second transistor, and a charge switch configured to switch a connecting state between the charge terminal, and the first transistor and the second transistor, from a cutoff state to a conducting state, in response to the drive signal. The second charge circuit satisfies a relationship of the following expression (2):

$$V\text{ref} \geq V_{cg} - V_f \quad (2)$$

where Vref is an output terminal voltage of the current source when the constant current flows between the high-potential-side electrode and the low-potential-side electrode of the first transistor, Vf is a forward voltage of the diode, and Vcg is a voltage of the charge terminal.

In the drive unit of the first aspect and second aspect, in response to the drive signal, the current control circuit starts charging the gates of the first and second transistors, using the current source, and the gate charge circuit starts charging the gates of the first and second transistors. Since electric power is supplied from not only the current source but also the gate charge circuit, the charging time of the gates of the first and second transistors is shortened. With the gate charge circuit thus provided, the response time from receiving of the drive signal to switching of the first and second transistors from OFF to ON is reduced. Namely, the response time from receiving of the drive signal to driving of the transistor to be driven is reduced.

With electric power supplied from the current source and the gate charge circuit, the gate voltage of the first and second transistors is increased. The right side ($V_{cg} \cdot C_{cg}/(C_{cg}+C_{cm})$) of the above expression (1) and the right side ($V_{cg}-V_f$) of the above expression (2) represent the maximum value of the gate voltage when it is assumed that the gates of the first and second transistors are charged only with the voltage Vcg of the charge terminal. Accordingly, when the gate voltage reaches [$V_{cg} \cdot C_{cg}/(C_{cg}+C_{cm})$], or the gate voltage reaches [$V_{cg}-V_f$], no more electric power can be supplied from the gate charge circuit. Namely, supply of electric power from the gate charge circuit is automatically stopped. Thereafter, electric power is supplied only from the current source. The gate voltage of the first and second transistors continues to rise due to supply of electric power from the current source, and the gate voltage of the first and second transistors exceeds the gate threshold voltage firth. Namely, the first and second transistors switch from OFF to ON. Then, constant current (current upper-limit value Idmax) of the current source flows between the high-potential-side electrode and low-potential-side electrode of the first transistor. The output terminal voltage of the current source is adjusted to be equal to the voltage Vref when the constant current flows between the high-potential-side electrode and low-potential-side electrode of the first transistor, and its magnitude is set to a value that is higher than the gate threshold voltage Vth. The first and second transistors switch from OFF to ON by the time when the gate voltage reaches the output terminal voltage Vref, and the gate voltage finally reaches the output terminal voltage Vref. At this time, the constant current (current upper limit value Idmax) of the current source flows between the high-potential-side electrode and low-potential-side electrode of the first transistor. In other words, the current flowing between the high-potential-side electrode and low-potential-side electrode of the first transistor does not exceed the constant current of the current source.

In the drive unit disclosed in this specification, the gates of the first and second transistors are rapidly charged by the gate charge circuit, in an initial rise period of the gate voltage, and the time (response time) from receiving of the drive signal to switching of the first and second transistors from OFF to ON is shortened. Meanwhile, supply of electric power from the gate charge circuit is stopped in the middle of gate charging. The gate voltage finally reaches the output terminal voltage Vref of the current source, and the current flowing between the high-potential-side electrode and low-potential-side electrode of the first transistor becomes equal to the constant value (current upper-limit value Idmax). In the following description, the current flowing between the high-potential-side electrode and low-potential-side electrode of the transistor may be called "main current". In the drive unit disclosed in this specification, after the first and second transistors switch from OFF to ON, the main current of the first transistor is limited to the constant current (current upper-limit value Idmax) delivered by the current source. Therefore, the first transistor is only required to permit flow of current having the current upper-limit value Idmax. This drive unit can increase the speed of gate charging of the first and second transistors, without increasing the main current of the first transistor, namely, without increasing electric power consumed by the first transistor. Namely, this drive unit can reduce the response time from receiving of the drive signal to driving of the transistor to be driven, without increasing the electric power consumption.

In the case of the first charge circuit, which uses the capacitor that satisfies the relationship of the above expression (1), supply of electric power from the first charge circuit is automatically stopped, by the time when the main current of the first transistor reaches the constant value (current upper-limit value Idmax). In the case of the second charge circuit, which satisfies the relationship of the above expression (2), supply of electric power from the second charge circuit is automatically stopped, by the time when the main current of the first transistor reaches the constant value (current upper-limit value Idmax). In the case of the second charge circuit, the diode as described above is provided, so that counter flow of current from the current source to the second charge circuit is prevented after the gate voltage exceeds [Vcg–Vf]. Also, when the expression (1) or the expression (2) in which the equal sign is used is satisfied, the gate charge circuit is stopped at the time when the main current of the first transistor reaches the constant value (current upper-limit value Idmax).

In the drive unit of the first aspect, the gate charge circuit may satisfy a relationship of the following expression (3):

$$Vcg \cdot Ccg/(Ccg+Ccm) \geq Vth \quad (3)$$

where Ccg is the capacitance of the capacitor, Ccm is the total capacitance of the gate capacitances of the first and second transistors, Vcg is the voltage of the charge terminal, and Vth is a gate threshold voltage of the first and second transistors.

Also, in the drive unit of the second aspect, the gate charge circuit may satisfy a relationship of the following expression (4):

$$Vcg-Vf \geq Vth \quad (4)$$

where Vf is the forward voltage, Vcg is the voltage of the charge terminal, and Vth is a gate threshold voltage of the first and second transistors.

The relationships of the above expression (3) and expression (4) mean that the gate voltage of the first and second transistors exceeds the gate threshold voltage during charging by the gate charge circuit. Namely, if the relationships of the above expression (3) and expression (4) are satisfied, the first and second transistors can be switched from OFF to ON during rapid charging by the gate charge circuit. The first charge circuit that satisfies the expression (3) and the second charge circuit that satisfies the expression (4) can farther shorten time it takes from receiving of the drive signal to switching of the first and second transistors from OFF to ON (namely, time it takes from receiving of the drive signal to driving of the power transistor), without increasing the power consumption of the first transistor.

In the drive unit of the first aspect and second aspect, the current control circuit may be a switch circuit that is configured to switch the connecting state between the gates of the first and second transistors and the discharge terminal (ground terminal) from the conducting state to the cutoff state, in response to the drive signal that switches the first transistor from OFF to ON. The current control circuit may also be a circuit that switches the current source from the output stopped state to the output state, in response to the drive signal. In the former case, the current source may deliver constant current at all times. This is because the power supplied from the current source is discharged through the switch circuit, and the gates are not charged. However, in the circuit of the former case, the output power of the current source is wasted while the first transistor is OFF, in the case of the circuit of the latter case, on the other hand, the current source is kept in the output stopped state while the drive signal indicates that the first transistor is OFF; therefore, electric power will not be wasted.

Next, a drive unit in which voltage-driven type P-channel transistors are employed in a current mirror circuit will be described. A drive unit of a third aspect of the disclosure disclosed in this specification includes a first transistor that is a voltage-driven type P-channel transistor, and has a low-potential-side electrode and a gate connected to each other, and a second transistor that is a voltage-driven type P-channel transistor, and has the same gate threshold voltage as the first transistor. The second transistor has a gate connected to the gate of the first transistor, and a high-potential-side electrode and a low-potential-side electrode to one of which a gate of the transistor to be driven is connected. The drive unit further includes a current source that is connected to the low-potential-side electrode of the first transistor, and is adapted to allow constant current to pass therethrough, a current control circuit configured to control start of discharging of the gates of the first transistor and the second transistor using the current source, in response to the drive signal, and a gate discharge circuit that discharges the gates of the first transistor and the and second transistor, separately from the current source. The gate discharge circuit includes configuration of a first discharge circuit.

The first discharge circuit includes a capacitor having one electrode connected to the gates of the first transistor and the second transistor, a charge terminal that supplies electric power to the other electrode of the capacitor, a discharge terminal that discharges electric power from the other electrode of the capacitor, and a charge switch configured to switch a destination to which the other electrode of the capacitor is connected, from the charge terminal to the discharge terminal, in response to the drive signal. The first discharge circuit satisfies a relationship of the following expression (5):

$$dVcg \cdot Ccm/(Ccg+Ccm) \geq VLref \quad (5)$$

where VLref is an input terminal voltage of the current source when the constant current flows between the high-potential-side electrode and the low-potential-side electrode of the first transistor, Ccg is a capacitance of the capacitor, Ccm is a total capacitance of gate capacitances of the first transistor and the second transistor, and dVcg is a voltage difference between an electric power supply terminal that supplies electric power to the gates of the first transistor and the second transistor, and the discharge terminal.

A drive unit of a fourth aspect of the disclosure disclosed in this specification includes a first transistor that is a voltage-driven type P-channel transistor, and has a lowpotential-side electrode and a gate connected to each other, and a second transistor that is a voltage-driven type P-channel transistor, and has the same gate threshold voltage as the first transistor. The second transistor has a gate connected to the gate of the first transistor, and a high-potential-side electrode and a low-potential-side electrode to one of which a gate of the transistor to be driven is connected. The drive unit further includes a current source that is connected to the low-potential-side electrode of the first transistor, and is adapted to allow constant current to pass therethrough, a current control circuit configured to control start of discharging of the gates of the first transistor and the second transistor using the current source, in response to the drive signal, and a gate discharge circuit that discharges the gates of the first transistor and the and second transistor, separately from the current source. The gate discharge circuit includes configuration of a second discharge circuit.

The second discharge circuit includes a discharge terminal that discharges electric power from the gates of the first transistor and the second transistor, a diode having an anode connected to the gates of the first transistor and the second transistor, and a cathode connected to the discharge terminal, and a discharge switch configured to switch a connecting state between the discharge terminal, and the first transistor and the second transistor, from a cutoff state to a conducting state, in response to the drive signal. The second discharge circuit satisfies a relationship of the following expression (6);

$$VLcg+Vf \geq VLref \quad (6)$$

where VLref is an input terminal voltage of the current source when the constant current flows between the high-potential-side electrode and the low-potential-side electrode of the first transistor, Vf is a forward voltage of the diode, and VLcg, is a voltage of the discharge terminal.

In the drive unit of the third aspect and fourth aspect including the gate discharge circuit that is the first discharge circuit or the second discharge circuit, in response to the drive signal, the current control circuit starts discharging the gates of the first and second transistors, using the current source, and the gate discharge circuit starts discharging the gates of the first and second transistors. Through the current source and the gate discharge circuit, the gates of the first and second transistors are quickly discharged. Thus, the time it takes from receiving of the drive signal to switching of the first and second transistors from OFF to ON can be shortened, and the transistor to be driven is driven with better response.

As the gate discharge proceeds, the gate voltage of the first and second transistors is lowered. The left side [dVcg·Ccm/(Ccg+Ccm)] of the above expression (5) and the left side [VLcg+Vf] of the above expression (6) represent the lowest value of the gate voltage when it is assumed that the gates of the first and second transistors are discharged only with the gate discharge circuit. Accordingly, if the gate voltage of the first and second transistors is lowered to [dVcg·Ccm/(Ccg+Ccm)] or [VLcg+Vf], discharge through the gate discharge circuit is automatically stopped, and the gates are discharged only through the current source. Thereafter, the gate voltage continues to be lowered by discharge through the current source, and becomes constant at the input terminal voltage VLref of the current source. The input terminal voltage VLref of the current source is set to be lower than the gate threshold voltage Vth, and the first and second transistors switch from OFF to ON by the time when the gate voltage reaches the input terminal voltage VLref. The input terminal voltage of the current source is adjusted to be equal to VLref when current of a constant value (current upper-limit value Idmax) flows between the high-potential-side electrode and low-potential-side electrode of the first transistor. Namely, after the first and second transistors switch from OFF to ON, the main current of the first transistor is limited to the constant value (current upper-limit value Idmax). Therefore, the first transistor is only required to allow flow of main current having the current upper-limit value Idmax. The drive unit including the current mirror circuit in which P-channel transistors are employed is also able to shorten time (response time) from receiving of the drive signal to driving of the transistor to be driven, without increasing the main current of the first transistor, namely, without increasing the electric power consumption.

In the case of the first discharge circuit, which uses the capacitor that satisfies the relationship of the above expression (5), discharge by the first discharge circuit is automatically stopped, by the time when the main current of the first transistor reaches the constant value (current upper-limit value Idmax). In the case of the second discharge circuit, which satisfies the relationship of the above expression (6), discharge by the second discharge circuit is automatically stopped, by the time when the main current of the first transistor reaches the constant value (current upper-limit value Idmax). In the case of the second discharge circuit, the diode as described above is provided, so that counter low of current from the second discharge circuit to the current source is prevented after the gate voltage becomes lower than "VLcg+Vf". Also, when the expression (5) or the expression (6) in which the equal sign is used is satisfied, the gate discharge circuit is stopped at a point in time at which the main current of the first transistor reaches the constant value (current upper-limit value Idmax).

In the drive unit of the third aspect, the gate discharge circuit it may satisfy a relationship of the following expression (7):

$$Vth \geq DVcg \cdot Ccm/(Ccg+Ccm) \quad (7)$$

where Ccg is the capacitance of the capacitor, am is the total capacitance of the gate capacitances of the first and second transistors, dVcg is the voltage difference, and Vth is a gate threshold voltage of the first and second transistors.

In the drive unit of the fourth aspect, the gate discharge circuit it may satisfy a relationship of the following expression (8):

$$Vth \geq VLcg+Vf \quad (8)$$

where Vf is the forward voltage, VLcg is the voltage, and Vth is a gate threshold voltage of the first and second transistors.

The relationships of the above expression (7) and expression (8) mean that the gate voltage of the first and second transistors becomes lower than the gate threshold voltage during discharging by the gate discharge circuit. Namely, if the relationships of the above expression (7) and expression (8) are satisfied, the first and second transistors switch from OFF to ON during discharging by the gate discharge circuit. The first discharge circuit that satisfies the expression (7) and the second discharge circuit that satisfies the expression (8) can further shorten response time, without increasing the power consumption of the first transistor.

In both of the drive unit including the current mirror circuit using the P-channel transistors, and the drive unit including the current mirror circuit using the N-channel transistors, a cutoff switch may be provided for cutting off current (main current) flowing between the high-potential-side electrode and the low-potential-side electrode of the first transistor after the first transistor and the second transistor switch from OFF to ON. In a general current mirror circuit, reference current continues to flow as the main current of the first transistor, even after the first and second transistors switch from OFF to ON. Even if the main current of the first transistor is cut off after switching of the first and second transistors from OFF to ON, the first and second transistors are held in the ON state. With the main current of the first transistor thus cut off after switching of the first and second transistors from OFF to ON, no current flows through the first transistor after cutoff of the main current, and power consumption can be further suppressed or reduced. Details of the technology disclosed in this specification and further improvements will be described below in "DETAILED DESCRIPTION OF EMBODIMENTS".

BRIEF DESCRIPTION OF THE DRAWINGS

Features, advantages, and technical and industrial significance of exemplary embodiments will be described below with reference to the accompanying drawings, in which like numerals denote like elements, and wherein:

FIG. 19 is a time chart of the drive unit of the eleventh embodiment.

DETAILED DESCRIPTION OF EMBODIMENTS

First Embodiment

Figure 1:
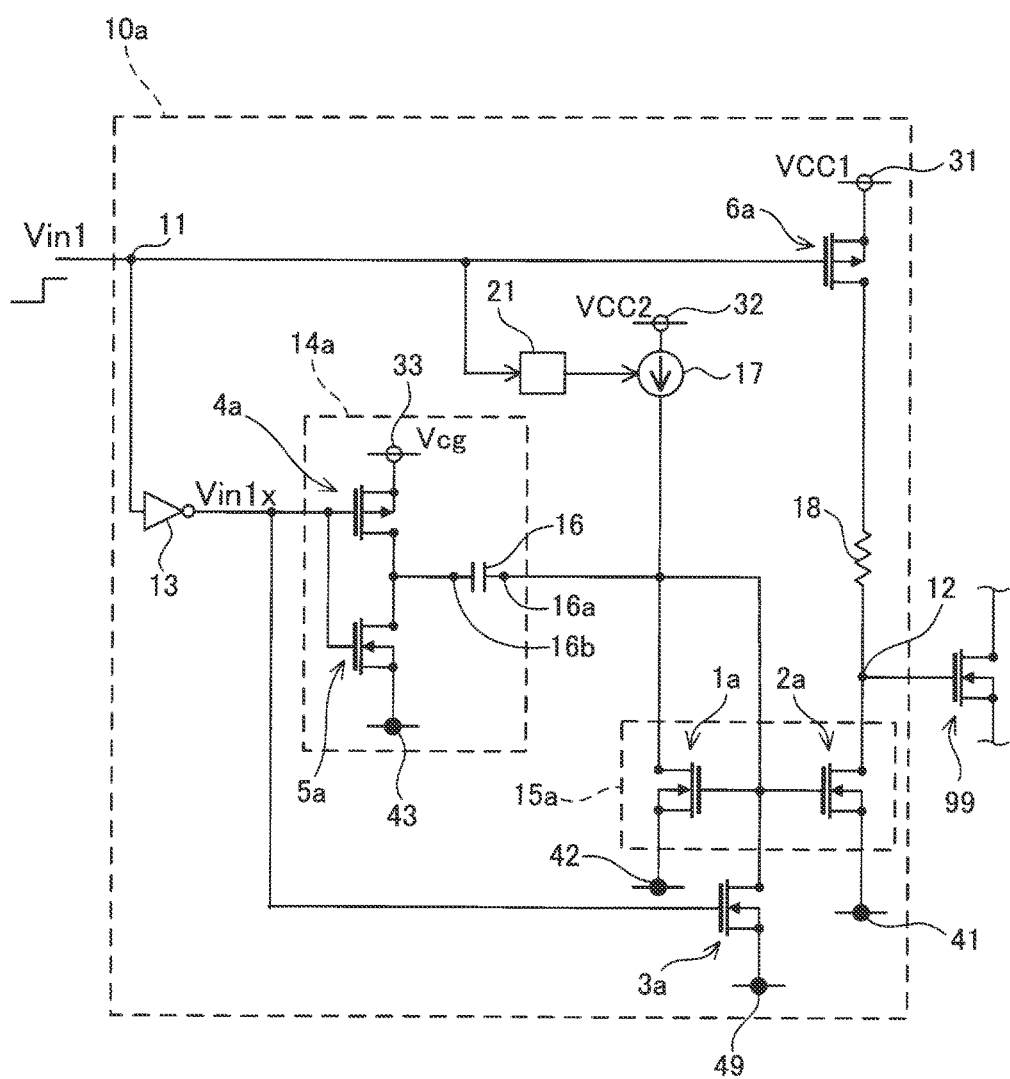
FIG. 1 is a block diagram of a drive unit of a first embodiment.
Figure 2:
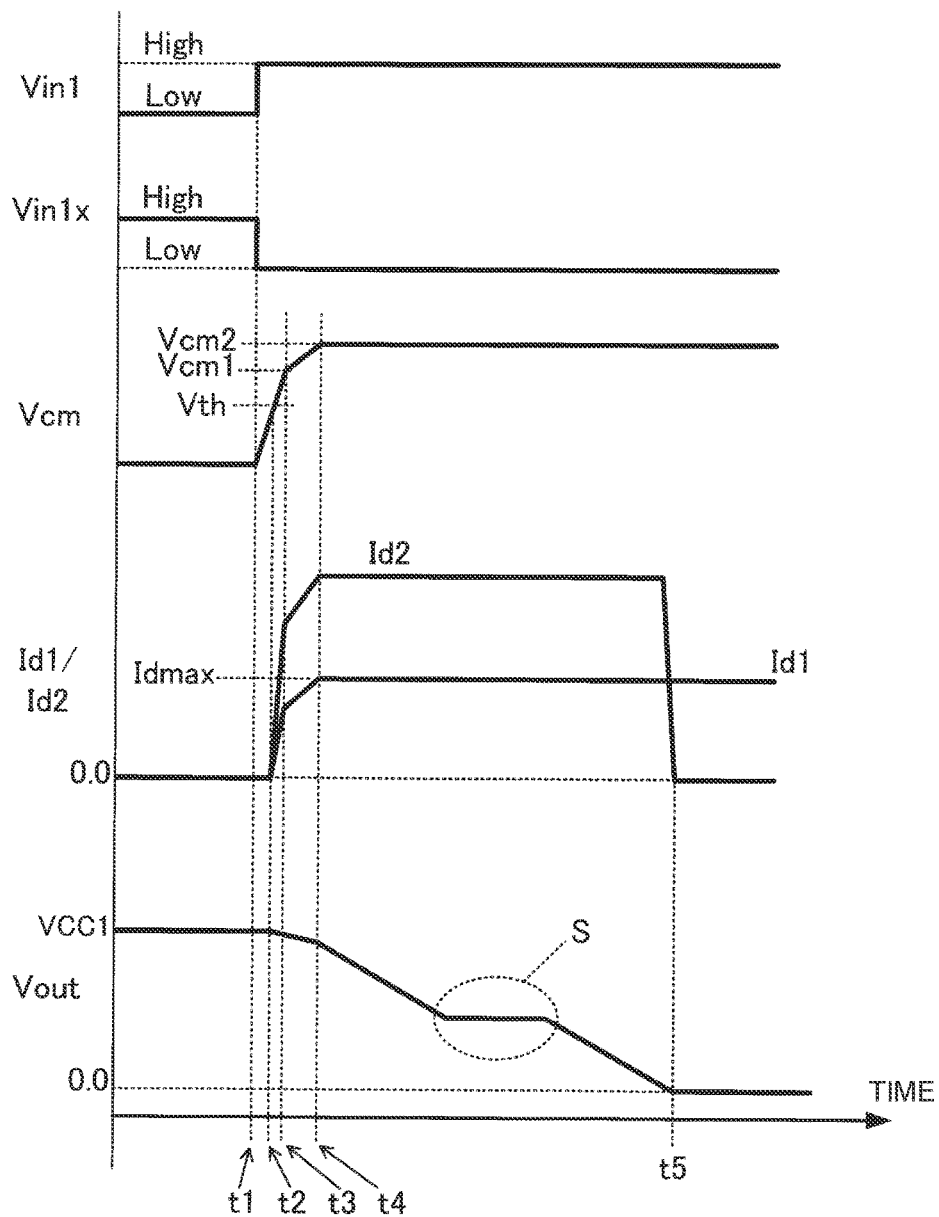
FIG. 2 is a time chart of the drive unit of the first embodiment.

Referring to FIG. 1 and FIG. 2, a drive unit of a first embodiment will be described. FIG. 1 is a block diagram of the drive unit 10a. FIG. 2 is a time chart showing operation of the drive unit 10a. The drive unit 103 is a unit or system for driving a power transistor 99. The power transistor 99 is a switching device used for converting electric power. For example, the power transistor 99 is a switching device of an inverter that converts direct current into alternating current, or a switching device of a voltage converter. A power conversion system including the power transistor 99 is not illustrated in the drawings, except for the power transistor 99. When the power conversion system includes two or more power transistors, the drive unit 10a is prepared for each of the power transistors.

The drive unit 10a switches the power transistor 99 between ON and OFF, based on a pulsed drive signal Vin1 received from a high-order control unit (not shown). The drive unit 10a drives the power transistor 99, using a pulse edge of the drive signal Vin1 as a trigger. When the drive signal Vin1 is at a low level ("Low" in FIG. 2), the drive unit 10a holds the power transistor 99 in the ON state. When the drive signal Vin1 switches from the low level to a high level ("High" in FIG. 2), the drive unit 10a switches the power transistor 99 from ON to OFF. Here, "ON" means a conducting state in which electric current is allowed to flow between a high-potential-side electrode and a low-potential-side electrode of a transistor, and "OFF" means a current cutoff state in which flow of electric current between the high-potential-side electrode and low-potential-side electrode of the transistor is cut off or inhibited.

The drive unit 10a switches first and second transistors 1a, 2a from OFF to ON, using a pulse edge at which the drive signal Vin1 switches from the low level to the high level, as a trigger, as will be described in detail later. In the following, operation to switch the first and second transistors 1a, 2a from OFF to ON will be mainly described. While a phrase "in response to the drive signal Vin1" often appears in the following description, this phrase specifically means that "in response to the drive signal Vin1, which is a drive signal that switches the power transistor 99 (transistor to be driven) between ON and OFF, and switches the first and second transistors 1a, 2a from OFF to ON".

The drive unit 10a includes an input terminal 11 and an output terminal 12. The above-mentioned high-order control unit is connected to the input terminal 11, and the input terminal 11 receives the drive signal Vin1. A gate of the power transistor 99 to be driven by the drive unit 10a is connected to the output terminal 12.

The drive unit 10a includes six transistors, i.e., first transistor is through sixth transistor 6a. The first transistor 1a, second transistor 2a, third transistor 3a, and the fifth transistor 5a are N-channel MOSFETs (Metal-Oxide Semiconductor Field Effect Transistors), and the fourth transistor 4a and the sixth transistor 6a are P-channel MOSFETs. The MOSFET has a gate that is insulated from a source and a drain, and is of a so-called voltage driven type, namely, whether the MOSFET is ON or OFF is determined based on the magnitude of the gate voltage. While the N-channel MOSFET is configured to be accompanied by a diode that constantly passes current from the source to the drain, the diode is not illustrated in FIG. 1 and other drawings. While the P-channel MOSFET is configured to be accompanied by a diode that constantly passes current from the drain to the source, the diode is not illustrated in FIG. 1 and other drawings. In this connection, a flywheel diode for transistor protection may be connected to each transistor.

Some power-supply positive terminals 31-33 and some power-supply negative terminals 41-43, 40 are provided inside the drive unit 10a. The power-supply positive terminals 31-33 are terminals that supply electric power to respective devices, and the power-supply negative terminals 41-43, 49 correspond to discharge terminals of electric current that flows out of respective devices. The voltage of each power-supply positive terminal and the voltage of each power-supply negative terminal are determined by a power-supply circuit (not shown). The power-supply negative terminals 41-43, 49 may correspond to the ground terminal of the drive unit 10a, or may be held at a voltage obtained by adding a given bias to the voltage of the ground terminal of the drive unit 10a. The power-supply positive terminals 31-33 may be held at the same voltage, or may be held at different voltages.

The power-supply positive terminal 31 is held at art ON voltage VCC1 of the power transistor 99. The power-supply negative terminal 41 is held at an OFF voltage of the power transistor 99. The power-supply positive terminals 32, 33 will be described later.

The drive unit 10a includes a NOT device 13 (inverter), capacitor 16, current source 17, resistor 18, and a current control circuit 21, in addition to the six transistors 1a-6a as described above. The first transistor 1a and the second transistor 2a constitute a current mirror circuit 15a, and the fourth transistor 4a, fifth transistor 5a, and the capacitor 16 constitute a gate charge circuit 14a.

The output terminal 12 of the drive unit 10a is connected to the power-supply positive terminal 31, via the sixth transistor 6a and the resistor H. More specifically, the source of the sixth transistor 6a is connected to the power-supply positive terminal 31, and the drain is connected to the output terminal 12 via the resistor 18. The second transistor 2a is connected between the output terminal 12, and the power-supply negative terminal 41. The drain of the second transistor 2a is connected to the output terminal 12, and the source is connected to the power-supply negative terminal 41. When the sixth transistor 6a is turned on, and the second transistor 2a is turned off, the gate voltage of the power transistor 99 is raised to the voltage VCC1 of the power-supply positive terminal 31, and the power transistor 99 is turned on. When the sixth transistor 6a is turned off, and the second transistor 2a is turned on, the gate voltage of the power transistor 99 is lowered to the voltage of the power-supply negative terminal 41, and the power transistor 99 is turned off.

The gate of the sixth transistor 6a is connected to the input terminal 11, and the sixth transistor 6a is switched between ON and OFF, in response to the drive signal Vin1 received by the input terminal 11. The sixth transistor 6a functions as a switch circuit that selectively allows and inhibits or cuts off current flow between the power-supply positive terminal 31 and the output terminal 12 (the gate of the power transistor 99). The sixth transistor 6a selectively allows and inhibits current flow between the power-supply positive terminal 31 and the output terminal 12, in response to the drive signal Vin1 received by the input terminal 11. While a current mirror circuit that will be described below may be employed as a switch circuit that selectively allows and inhibits current flow between the power-supply positive terminal 31 and the output terminal 12, the switch circuit of this embodiment is simply represented by a single transistor (sixth transistor 6a), for the sake of easy understanding of the drawings. The sixth transistor 6a is quickly switched by a pulse edge of the drive signal Vin1 received by the input terminal 11. The response, or a length of time it takes from the time when the drive signal Vin1 is received to the time when the power transistor 99 is driven, depends on operation of the current mirror circuit 15a that will be described below.

The second transistor 2a and the first transistor 1a constitute the current mirror circuit 15a, and the second transistor 2a is switched between ON and OFF according to ON/OFF of the first transistor 1a. Transistors having the same gate threshold voltage Vth are employed as the first transistor 1a and the second transistor 2a.

The current mirror circuit 15a will be described. As described above, each of the first transistor 1a and the second transistor 2a is a voltage-driven type N-channel transistor. The drain corresponds to a high-potential-side electrode, and the source corresponds to a low-potential-side electrode. As described above, the second transistor 2a is connected between the output terminal 12 and the power-supply negative terminal 41. The drain (high-potential-side electrode) of the second transistor 2a is connected to the output terminal 12. As described above, the gate of the power transistor 99 is connected to the output terminal 12. The drain of the first transistor 1a is connected to the gate. The source of the first transistor 1a is connected to the power-supply negative terminal 42. The gate of the first transistor 1a is connected to the gate of the second transistor 2a.

The drain of the third transistor 3a is connected to the gates of the first and second transistors 1a, 2a. The source of the third transistor 3a is connected to the power-supply negative terminal 49. The third transistor 3a is provided for discharging the gates of the first and second transistors 1a, 2a through the power-supply negative terminal 49. The gate of the third transistor 3a is connected to the input terminal 11 via the NOT device 13. Therefore, the gate of the third transistor 3a receives a signal (inversion signal Vin1x) obtained by inverting the low and high levels of the drive signal Vin1. The third transistor 3a discharges the gates of the first and second transistors 1a, 2a, in response to the drive signal Vin1 received by the input terminal 11.

The current source 17 is connected to the drain (high-potential-side electrode) of the first transistor 1a, and the power-supply positive terminal 32 to which voltage VCC2 is supplied is connected to the current source 17. A current control circuit 21 is connected to the current Source 17. The current control circuit 21 receives the drive signal Vin1. The current control circuit 21 switches the current source 17 between an output stopped state and a current output state, in response to the drive signal Vin1. More specifically, when the drive signal Vin1 is at the low level, the current control circuit 21 holds the current source 1 in the output stopped state. When the drive signal Vin1 switches from the low level to the high level, the current control circuit 21 turns the current source 17 into the current output state. The current source 17, when it is in the output state, is supplied with electric power from the power-supply positive terminal 32, and delivers a predetermined constant current. (current upper-limit value Idmax). The output terminal voltage of the current source 17 is adjusted so as to be equal to a predetermined voltage Vref when the first transistor 1a is placed in the ON state, and the constant current (current upper-limit value Idmax) flows between the drain and source of the first transistor 1a. During a transition period from the output stopped state to the time when the current source 17 stably delivers the constant current (current upper-limit value Idmax), the output terminal voltage gradually changes from zero to the voltage Vref. In the following description, current that flows between a drain and a source of a transistor will be called "drain current" or "main current".

When the current control circuit 21 switches the current source 17 from the output stopped state to the output state, in response to the drive signal Vin1, electric power starts being supplied from the current source 17 to the gates of the first and second transistors 1a, 2a (the gates start being charged).

The gate charge circuit 14a is connected to the drain of the first transistor 1a, and the gates of the first and second transistors 1a, 2a. The gate charge circuit 14a charges the gates of the first and second transistors 1a, 2a, separately from the current source 17. The gate charge circuit 14a consists of the power-supply positive terminal 33 held at a voltage Vcg, corresponding power-supply negative terminal 43, two transistors (fourth transistor 4a and fifth transistor 5a), and the capacitor 16. The fourth transistor 4a is a P-channel MOSFET, and the fifth transistor 5a is an N-channel MOSFET. The fourth transistor 4a and the fifth transistor 5a are connected in series between the power-supply positive terminal 33 and the power-supply negative terminal 43. More specifically, the source of the fourth transistor 4a is connected to the power-supply positive terminal 33, and the drain of the fourth transistor 4a is connected to the drain of the fifth transistor 5a. The source of the fifth transistor 5a is connected to the power-supply negative terminal 43. One electrode 16a of the capacitor 16 is connected to the drain and gate of the first transistor 1a of the current mirror circuit 15a, and the gate of the second transistor 2a. The other electrode 16b of the capacitor 16 is connected to a middle point between the fourth transistor 4a and the fifth transistor 5a that are connected in series.

The gates of the fourth and fifth transistors 4a, 5a are both connected to the input terminal 11 via the NOT device 13. Therefore, the gates of the fourth and fifth transistors 4a, 5a receive a signal (inversion signal Vin1x) obtained by inverting the low level and high level of the drive signal Vin1. When the gates of the fourth and fifth transistors 4a, 5a are held at a low potential, the P-channel fourth transistor 4a is ON, and the N-channel fifth transistor 5a is OFF. As a result, the electrode 16b of the capacitor 16 is connected to the power-supply positive terminal 33, and the capacitor 16 is charged. When the gates of the fourth and fifth transistors 4a, 5a are held at a high potential, the fourth transistor 4a is OFF, and the fifth transistor 5a is ON. As a result, the electrode 161 of the capacitor 16 is connected to the power-supply negative terminal 43, and the capacitor 16 is discharged. Namely, the capacitor 16 is charged when it is supplied with electric power from the power-supply positive terminal 33, and is discharged through the power-supply negative terminal 43. The fourth and fifth transistors 4a, 5a function as a switch for switching the destination to which the electrode 16b of the capacitor 16 is connected from the power-supply negative terminal 43 to the power-supply positive terminal 33, in response to the drive signal Vin1. The electrode 16a of the capacitor 16 is connected to the gates of the first and second transistors 1a, 2a. Therefore, the gates of the first and second transistors 1a, 2a are charged when the capacitor 16 is charged, and the gates of the first and second transistors 1a, 2a are discharged when the capacitor 16 is discharged.

The operation of the drive unit 10a will be generally described. Suppose the case where the drive unit 10a receives a pulse edge at which the drive signal Vin1 switches from the low level (Low) to the high level (High). Before the drive signal Vin1 switches to the high level, the input terminal 11 is held at a low potential. At this time, the sixth transistor 6a is held in the ON state. Also, the current control circuit 21 holds the current source 17 in the output stopped state. The gates of the fourth and fifth transistors 4a, 5a of the gate charge circuit 14a receive a high-level signal via the NOT device 13. Therefore, the electrode 16b of the capacitor 16 is connected to the power-supply negative terminal 43, and the capacitor 16 is held in a discharged state, as described above. The gate of the N-channel third transistor 3a also receives the high-level signal via the NOT device 13. Therefore, the third transistor 3a is placed in the ON state, and the gates of the first and second transistors 1a, 2a of the current mirror circuit 15a are connected to the power-supply negative terminal 49. As a result, the first and second transistors 1a, 2a are held in the OFF states. Since the second transistor 2a is held in the OFF state, and the sixth transistor 6a is held in the ON state, the output terminal 12 is held at the voltage VCC1 of the power-supply positive terminal 31. Namely, the power transistor 99 is held in the ON state.

The operation of the drive unit 10a when the drive signal Vin1 switches from the low level (Low) to the high level (High) will be generally described. When the drive signal Vin1 switches from the low level to the high level, the sixth transistor 6a is turned off, and the second transistor 2a is turned on. As a result, the potential of the output terminal 12 is lowered to the potential of the power-supply negative terminal 41, and the power transistor 99 switches from ON to OFF.

The operation of the drive unit 10a when the drive signal Vin1 switches from the low level to the high level will be specifically described. When the drive signal Vin1 switches from the low level to the high level, the third transistor 3a is turned OFF, and current flow between the gates of the first and second transistors 1a, 2a of the current mirror circuit 15a and the power-supply negative terminal 49 is cut off. At the same time, the current control circuit 21 turns the current source 17 into the output state, in response to the drive signal Vin1. As a result, the current source 17 starts delivering current, and the current starts being supplied to the first transistor 1a. Since the first transistor 1a is in the OFF state at first, the drain and the source are disconnected from each other. Therefore, the current supplied from the current source 17 is supplied to the gates of the first and second transistors 1a, 2a. Namely, the current control circuit 21 starts charging the gate(s) of the first transistor 1a (and the second transistor 2a) using the current source 17, in response to the drive signal Vin1.

Also, in response to the drive signal Vin1, the destination to which the capacitor 16 of the gate charge circuit 14a is connected is switched from the power-supply negative terminal 43 to the power-supply positive terminal 33, and the capacitor 16 is charged. Since electric power is supplied to the capacitor 16 that has been in the discharged state, electric power is supplied front the gate charge circuit 14a to the gates of the first and second transistors 1a, 2a through the capacitor 16. The gates of the first and second transistors 1a, 2a are supplied with electric power from both of the current source 17 and the gate charge circuit 14a, and are rapidly charged. The gate voltage of the first and second transistors 1a, 2a rapidly increases, and the first and second transistors 1a, 2a switch from OFF to ON. Since the second transistor 2a is turned on, and the sixth transistor 6a is turned off as described above, the potential of the output terminal 12 is lowered to the potential of the power-supply negative terminal 41, the power transistor 99 is switched front ON to OFF. Namely, the drive unit 10a switches the power transistor 99 from ON to OFF, in response to the pulsed drive signal Vin1 from the high-order control unit.

On the other hand, when the drive signal Vin1 switches from the high level (High) to the low level (Low), the voltage of the output terminal 12 of the drive unit 10a is raised to the voltage VCC1 of the power-supply positive terminal 31, and the power transistor 99 is switched from OFF to ON. The operation of the drive unit 10a when the potential of the output terminal 12 switches from the low potential to the high potential will not be described herein.

The gate charge circuit 14a automatically stops supply of electric power by the time when the output current of the current source 17 reaches the current upper-limit value Idmax. This is achieved when the output terminal voltage Vref of the current source 17 at the time when current of the current upper-limit value Idmax flows between the drain and source of the first transistor 1a due to the output current (reference current) of the current source 17, the capacitance Ccg of the capacitor 16, the total capacitance Ccm of the gate capacitances of the first and second transistors 1a, 2a, and the voltage Vcg of the power-supply positive terminal 33 for charging the capacitor 16, satisfy the relationship of the following expression (1).

$$Vref \geq Vcg \cdot Ccg/(Ccg+Ccm) \quad (1)$$

The right side [Vcg·Ccg/(Ccg+Ccm)] of the above expression (1) means voltage that is realized at the electrode 16a closer to the current mirror circuit 15a, of the capacitor 16, due to the voltage Vcg of the power-supply positive terminal 33. In other words, [Vcg·Ccg/(Ccg+Ccm)] corresponds to the gate voltage of the first and second transistors 1a, 2a achieved by the voltage Vcg of the power-supply positive terminal 33. In the following description, symbol Vcm represents the gate voltage of the first and second transistors 1a, 2a, and symbol Vth represents the gate threshold voltage of the first and second transistors 1a, 2a.

As described above, the current source 17 and the gate charge circuit 14a start supply of electric power, in response to the drive signal Vin1. As the supply of electric power is started, the gate voltage Vcm of the first and second transistors 1a, 2a is increased. The power is supplied from both of the current source 17 and the gate charge circuit 14a, to the gates of the first and second transistors 1a, 2a, until the gate voltage Vcm increases up to [Vcg·Ccg/(Ccg+Ccm)]. Once the gate voltage Vcm reaches [Vcg·Ccg/(Ccg+Ccm)], the gate charge circuit 14a cannot deliver current any longer, and supply of electric power from the gate charge circuit 14a is stopped. Since the voltage Vref of the output terminal when the current source 17 supplies current to the drain of the first transistor 1a (namely, the output terminal voltage at the time when the upper-limit current Idmax is delivered) is equal to or higher than [Vcg·Ccg/(Ccg+Ccm)], electric power continues to be supplied through the current source 17. The voltage Vref corresponds to the maximum voltage of the output terminal of the current source 17.

The maximum voltage Vref of the output terminal of the current source 17 is set to a higher level than the gate threshold voltage Vth. If the gate voltage Vcm of the first and second transistors 1a, 2a exceeds the gate threshold volt Vth, the first and second transistors 1a, 2a switch from OFF to ON at the same time. If the first transistor 1a is turned on, current (drain current) flows between the drain and source of the first transistor 1a. Finally, the gate voltage Vcm becomes equal to Vref, and the drain current of the first transistor 1a becomes equal to the current upper-limit value Idmax of the current source 17.

Since the main current of the first transistor 1a does not exceed the magnitude of Idmax, as stated above, the size (channel width) of the first transistor 1a is only required to permit the current upper-limit value Idmax.

Where symbol M1 represents the size (channel width) of the first transistor 1a, and symbol M2 represents the size (channel width) of the second transistor 2a, a relationship that Id2=(M2/M1)×Id1 is established between the drain current Id1 that flows through the first transistor 1a, and the drain current Id2 that flows through the second transistor 2a. Namely, if the size M1 of the first transistor 1a is made smaller than the size M2 of the second transistor 2a, the second transistor 2a can be switched with small power consumption. This means that the drive unit 10a can switch the power transistor 99 while suppressing or reducing electric power consumption.

In order to reduce the size M1 of the first transistor 1a, the current upper-limit value Idmax of the current source 17 needs to be reduced. The reduction of the current upper-limit value Idmax of the current source 17 means reduction of electric current with which the gates of the first and second transistors 1a, 2a are charged, and the charging speed is reduced. If the gates of the first and second transistors 1a, 2a are charged slowly it takes some time from the time when the drive signal Vin1 is received to the time when the first and second transistors 1a, 2a switch from OFF to ON. Namely, the response is delayed, in other words, the length of time from the time when the drive signal Vin1 is received to the time when the power transistor 99 is driven is increased. Thus, the drive unit 10a includes the gate charge circuit 14a for temporarily supplying electric power to the gates of the first and second transistors 1a, 2a, in addition to the current source 17. With the gate charge circuit 14a thus provided, the speed of charging the gates of the first and second transistors 1a, 2a is increased, and the current (main current) that constantly flows between the drain and source of the first transistor 1a is limited to the current upper-limit value Idmax or smaller. Namely, the drive unit 10a makes it possible to reduce the length of time it takes from the time when the drive signal Vin1 is received to the time when the power transistor 99 is driven, while suppressing or reducing electric power consumption.

Referring to the time chart of FIG. 2, the operation of the drive unit 10a will be described again. Vin1 is a drive signal transmitted from a high-order control unit. Vin1x is an inversion signal of the drive signal and is supplied to the gate of each of the third transistor 3a, fourth transistor 4a, and the fifth transistor 5a. As described above, Vcm denotes the gate voltage of the first and second transistors 1a, 2a. Id1 denotes the drain current of the first transistor 1a, and Id2 denotes the drain current of the second transistor 2a. Vout denotes the voltage of the output terminal 12.

At time t1, the drive signal Vin1 changes from a low level (Low) to a high level (High). At time t1, Vin1x changes from a high level (High) to a low level (Low). As described above, if the drive signal Vin1 changes from the low level to the high level, both the third transistor 3a and the sixth transistor 6a switch from ON to OFF. Also, the first transistor 1a and the second transistor 2a switch from OFF to ON, as will be described later. Time t1 is the time of receiving of a pulse edge of the drive signal Vin1, which is a command for switching of the power transistor 99.

If the inversion signal Vin1x switches from the high level to the low level, the current control circuit 21 switches the current source 17 from the output stopped state to the output state. As a result, electric power starts being supplied from the current source 17. Namely, the current source 17 starts charging the gates of the first and second transistors 1a, 2a. At the same time, the destination to which the electrode 16b of the capacitor 16 is connected changes from the power-supply negative terminal 43 to the power-supply positive terminal 33, and electric power starts being also supplied from the gate charge circuit 14a. With electric power thus supplied from both of the current source 17 and the gate charge circuit 14a, the gate voltage Vcm is rapidly increased.

The total capacitance Ccm of the gate capacitance of the first transistor 1a and the gate capacitance of the second transistor 2a, voltage Vcg of the power-supply positive terminal 33, and the gate threshold voltage Vth of the first transistor 1a and the second transistor 2a, are determined so as to satisfy the relationship of the following expression (3).

$$Vcg \cdot Ccg/(Ccg+Ccm) \geq Vth \qquad (3)$$

As described above, [Vcg·Ccg/(Ccg+Ccm)] is the gate voltage Vcm that is realized by the voltage Vcg of the power-supply positive terminal 33. In FIG. 2, the voltage Vcm1 corresponds to [Vcg·Vcg/(Ccg+Ccm)]. The above expression (3) means that the gate threshold voltage Vth is lower than the voltage Vcm1. Therefore, while electric power is kept supplied from the gate charge circuit 14a, the first transistor 1a and the second transistor 2a switch from OFF to ON. At time t2, the gate voltage Vcm reaches the gate threshold voltage Vth, and the first transistor 1a and the second transistor 2a switch from OFF to ON. Accordingly, from time t2, the drain currents Id1, Id2 start flowing, and the voltage Vout of the output terminal 12 starts being lowered. The drive unit 10a receives the pulse edge of the drive signal Vin1 at time t1, and the first and second transistors 1a, 2a of the current mirror circuit 15a switch from OFF to ON at time t2.

At time t3, the gate voltage Vcm reaches the voltage Veil. At time t3, the gate charge circuit 14a becomes unable to cause any more current to flow from the capacitor 16 to the first transistor 1a. Namely, at time t3 at which the gate voltage Vcm reaches the voltage Vcm1, supply of electric power from the gate charge circuit 14a is automatically stopped. After time t3, only the output power of the current source 17 is supplied to the first transistor 1a. Since the supply of electric power from the gate charge circuit 14a is stopped, the rate of increase of the drain current Id1 of the first transistor 1a is reduced after time t3. At time t4, the drain current Id1 reaches the current upper-limit value Idmax. After time t4, the drain current Id1 having the current upper-limit value Idmax keeps flowing through the first transistor 1a. After time t2, the drain current Id2, which is obtained by multiplying the drain current Id1 of the first transistor 1a by [M2/M1], flows through the second transistor 2a. The drain current Id2 of the second transistor 2a is produced by gate discharge of the power transistor 99. As the drain current Id2 flows through the second transistor 2a, the gate voltage of the power transistor 99, namely, the voltage (output terminal voltage Vout) of the output terminal 12, is lowered. When the output terminal voltage Vout becomes insufficient for causing current of Id2=Id1×(M2/M1) to flow, the output terminal voltage Vout and the drain current Id2 of the second transistor 2a are both reduced, and become equal to zero at time t5. Between time t4 and time t5, the power transistor 99 switch from ON to OFF when the output terminal voltage Vout becomes lower than the gate threshold voltage of the power transistor 99.

After time t4, the gate voltage Vcm2 is equal to the output terminal voltage Vref of the current source 17 when it delivers the upper-limit current Idmax (Vcm2=Vref). In a certain period after time t4, the gate voltage of the power transistor 99, namely, the voltage (output terminal voltage Vout) of the output terminal 12 becomes temporarily flat. The period indicated by symbol S in FIG. 2 indicates the "period in which the output terminal voltage Vout becomes flat". This is a phenomenon caused by the mirror effect of the current mirror effect. The same or similar phenomenon is observed in subsequent time charts.

Figure 3:
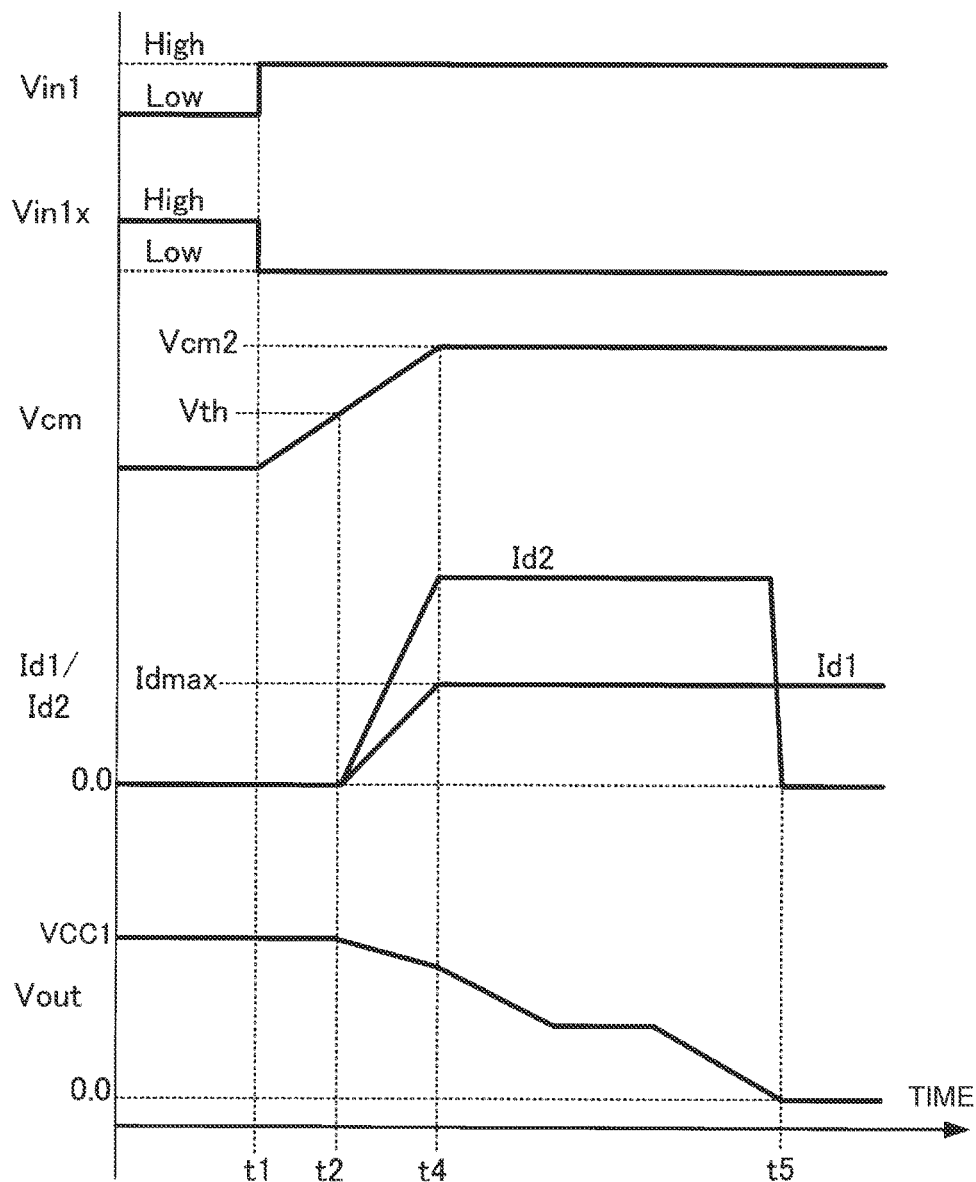
FIG. 3 is a time chart of the case where no gate charge circuit is provided.

FIG. 3 shows a time chart of the case where the drive unit does not include the gate charge circuit 14a. At time t1, the drive signal Vin1 changes from a low level (Low) to a high level (High), and electric current starts being supplied from the current source 17. In the case of FIG. 3 in which the gate charge circuit 14a is not provided, the rate of increase of the gate voltage Vcm is smaller than the rate of increase in the period of time t1-t3 of FIG. 2. Therefore, time t2 at which the gate voltage Vcm reaches the gate threshold voltage Vth is later than that in the case of FIG. 2. Namely, it takes time from the time when the drive signal Vin1 is received to the time when the first and second transistors 1a, 2a of the current mirror circuit 15a switch from OFF to ON. As a result, time t5 at which the output terminal voltage Vout is reduced down to zero is later than that in the case of FIG. 2. The length of time it takes from the time when the drive unit 10a of the first embodiment (the case of FIG. 2) receives the drive signal Vin1 to the time when it drives the power transistor 99 is shorter than that of the drive unit (the case of FIG. 3) that does not have the gate charge circuit 14a. In both of the case of FIG. 2 and the case of FIG. 3, the drain current Id1 that flows through the first transistor 1a is equal to or smaller than Idmax.

As is apparent, from comparison between FIG. 2 and FIG. 3, the drive unit 10a including the gate charge circuit 14a can shorten the length of time from receiving of the drive signal Vin1 to driving of the power transistor 99, without increasing the drain current Id1 of the first transistor 1a of the current mirror circuit 15a (namely, without increasing the electric power consumption). The gate charge circuit 14a including the capacitor that satisfies the expression (1) affords this advantage to the drive unit 10a.

In the drive unit 10a of the first embodiment, when the drive unit Vin1 switches from the low level to the high level, the current source 17 starts supplying electric power, and the gate charge circuit 14a starts supplying electric power. When the amount of charge per unit time of the gate charge circuit 14a is larger than the amount of charge per unit time of the current source 17, a given time difference may be provided between the start of power supply of the gate charge circuit 14a and the start of power supply of the current source 17. For example, the gate charge circuit 14a starts supplying electric power immediately after switching of the drive signal Vin1 from the low level to the high level, and the current source 17 starts supplying electric power after waiting for the given time difference after switching of the drive signal Vin1. The time difference is, for example, tune it takes for the gate voltage Vcm to reach the maximum voltage Vcm1=[Vcg·Ccg/(Ccg+Ccm)] provided by the gate charge circuit 14a.

Second Embodiment

Figure 4:
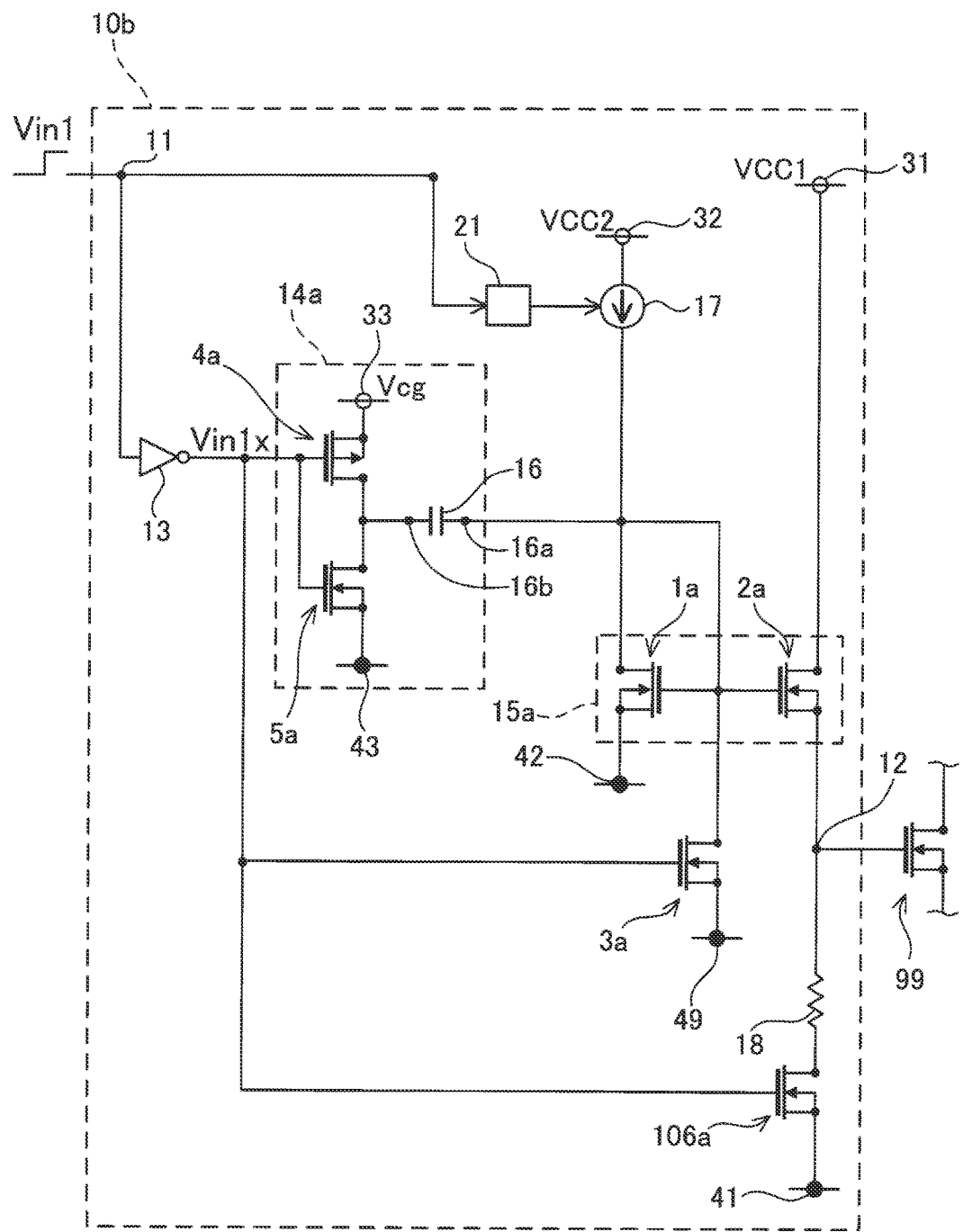
FIG. 4 is a block diagram of a drive unit of a second embodiment.

Referring to FIG. 4, a second embodiment will be described. In the drive unit 10a of the first embodiment, the sixth transistor 6a is connected between the power-supply positive terminal 31 and the output terminal 12, and the second transistor 2a of the current mirror circuit 15a is connected between the output terminal 12 and the power-supply negative terminal 41. On the other hand, in a drive unit 10b of the second embodiment, the second transistor 2a of the current mirror circuit 15a is connected between the power-supply positive terminal 31 and the output terminal 12, and the resistor 18 and a sixth transistor 106a are connected between the output terminal 12 and the power-supply negative terminal 41. A gate of the sixth transistor 106a is connected to the NOT device 13, and the inversion signal Vin1x is transmitted to the gate of the sixth transistor 106a. The power-supply negative terminal 42 is controlled so as to be at the same voltage as the output terminal 12.

In the drive unit 10b, when the drive signal Vin1 switches from the low level (Low) to the high level (High), the sixth transistor 106a switches from ON to OFF, and the second transistor 2a switches from OFF to ON. As a result, the potential of the output terminal 12 is raised from the potential of the power-supply negative terminal 41 to the voltage VCC1 of the power-supply positive terminal 31, and the power transistor 99 switches from OFF to ON.

The current mirror circuit 15a, gate charge circuit 14a, and the current source 17 of the drive unit 10b of FIG. 4 are identical with those of the drive unit 10a of the first embodiment, and therefore, will not be described in detail. The drive unit 10a of the first embodiment of FIG. 1 is different from the drive unit 10b of the second embodiment in that the second transistor 2a of the current mirror circuit 15a is connected between the output terminal 12 and the power-supply negative terminal 41 in the drive unit 10a, whereas the second transistor 2a is connected between the power-supply positive terminal 31 and the output terminal 12 in the drive unit 10b. However, the function and effect of the gate charge circuit 14a in the drive unit 10b are identical with those of the drive unit 10a of FIG. 1. Like the drive unit 10a of FIG. 1, the drive unit 10b of FIG. 4 can shorten the length of time from receiving of the drive signal Vin1 to driving of the power transistor 99, while suppressing or reducing electric power consumption.

A point to note in connection with the first and second embodiments will be stated. In the drive unit 10a of the first embodiment, each parameter is set so that the relationship of the above expression (3) is satisfied. When the relationship of the expression (3) is not satisfied, the gate voltage Vcm exceeds the gate threshold voltage Vth at a point in time between time t3 and time t4 in FIG. 2, and the first transistor 1a and the second transistor 2.a switch from OFF to ON. In this case, too, the first and second transistors 1a, 2a can be switched in a shorter time, as compared with the case of FIG. 3 where no gate charge circuit is provided. The same point to note is applied to the second embodiment.

Third Embodiment

Figure 5:
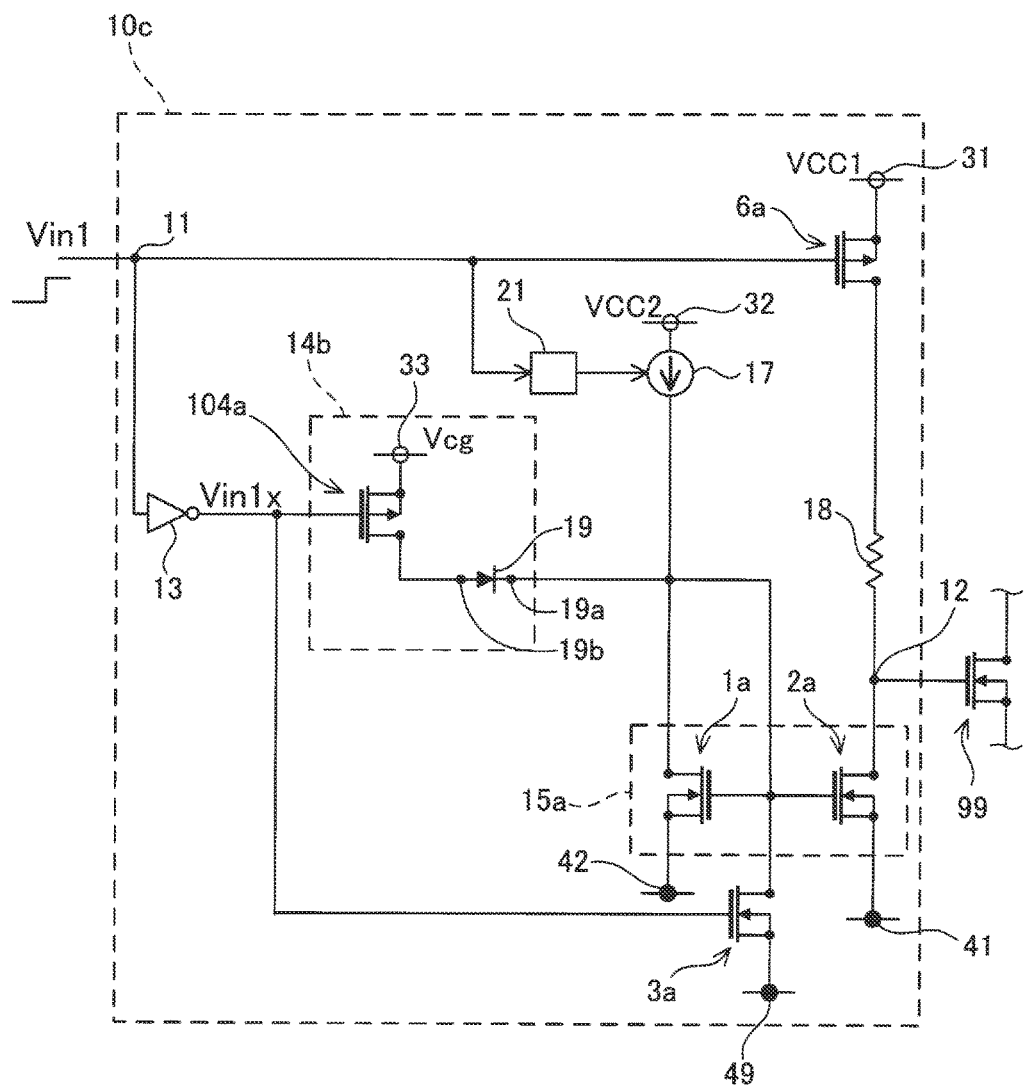
FIG. 5 is a block diagram of a drive unit of a third embodiment.

Referring to FIG. 5, a drive unit 10c of a third embodiment will be described. In the drive unit 10c of the third embodiment, a gate charge circuit 14b is different from the gate charge circuit 14a of the drive unit 10a of the first embodiment. In the block diagram of FIG. 5, the devices other than the gate charge circuit 14b are identical with the corresponding devices shown in the block diagram of FIG. 1, and therefore, will not be described.

Like the gate charge circuit 14a of the first embodiment, the gate charge circuit 14b is connected to the drain and gate of the first transistor 1a, and the gate of the second transistor 2a. The gate charge circuit 14b consists of the power-supply positive terminal 33 to which the voltage Vcg is supplied, a voltage-driven type P-channel fourth transistor 104a, and a diode 19. A cathode 19a of the diode 19 is connected to the drain and gate of the first transistor 1a, and the gate of the second transistor 2a. An anode 19b of the diode 19 is connected to the power-supply positive terminal 33 via the fourth transistor 104a. A gate of the fourth transistor 104a is connected to the input terminal 11 via the NOT device 13. Namely, the fourth transistor 104a functions as a switch for switching the connecting state between the power-supply positive terminal 33 and the first and second transistors 1a, 2a from a cutoff state to a conducting state, in response to the drive signal Vin1.

The output terminal voltage Vref of the current source 17 when current of the current upper-limit value Idmax flows between the drain and source of the first transistor 1a due to the output current (reference current) of the current source 17, forward voltage Vf of the diode 19, and the voltage Vcg of the power-supply positive terminal 33 are determined so as to satisfy the relationship of the following expression (2).

$$Vref \gtrsim Vcg - Vf \quad (2)$$

Further, the forward voltage Vf, voltage Vcg of the power-supply positive terminal 33, and the gate threshold voltage Vth of the first and second transistors 1a, 2a are determined so as to satisfy the following expression (4).

$$Vcg - Vf \gtrsim Vth \quad (4)$$

Like the drive unit 10a of the first embodiment, the drive unit 10c switches the power transistor 99 from ON to OFF when the pulsed drive signal Vin1 received by the input terminal 11 switches from a low level (Low) to a high level (High). The operation of the drive unit 10c, mainly, that of the gate charge circuit 14b, will be described.

When the drive signal Vin1 that switches from the low level (Low) to the high level (High) is received, the current control circuit 21 switches the current source 17 connected between the power-supply positive terminal 32 and the first transistor 1a from the output stopped state to the output state. As a result, electric power starts being supplied from the current source 17 to the first transistor 1a. At the same time, the gate of the fourth transistor 104a switches from a high potential (High) to a low potential (Low), in response to the inversion signal Vin1x of the drive signal Vin1, and the connecting state between the power-supply positive terminal 33 and the first and second transistors 1a, 2a switches from the cutoff state to the conducting state. The gate charge circuit 14b charges the gates of the first and second transistors 1a, 2a, separately from the current source 17. Until the gate voltage Vcm of the first and second transistors 1a, 2a reaches [Vcg−Vf], electric power is supplied from both the current source 17 and the gate charge circuit 14b to the gates of the first and second transistors 1a, 2a. As a result, the gate voltage Vcm is rapidly increased. When the gate voltage Vcm reaches [Vcg−Vf], supply of electric power from the gate charge circuit 14b is automatically stopped. According to the above expression (4), the first and second transistors 1a, 2a switch from OFF to ON, by the time when the gate voltage Vcm reaches [Vcg−Vf]. As a result, the drain current starts flowing through the first and second transistors 1a, 2a.

According to the relationship of the above expression (2), electric power continues to be supplied from the current source 17, even after the gate voltage Vcm reaches [Vcg−Vf]. When the gate voltage Vcm exceeds [Vcg−Vf], the diode 19 prevents current from flowing from the current source 17 into the gate charge circuit 14b. With electric power thus supplied from the current source 17, the gate voltage Vcm increases to be higher than [Vcg−Vf].

After the gate voltage Vcm exceeds [Vcg-Vf], the gate voltage Vcm increases up to the voltage Vref, with electric power supplied front the current source 17, and the drain current Id1 flowing through the first transistor 1a increases up to the current upper limit value Idmax. Thereafter, the gate voltage Vcm is kept at the voltage Vref, and the drain current of the current upper-limit value Idmax keeps flowing through the first transistor 1a.

When the second transistor 2a, as well as the first transistor 1a, switches from OFF to ON, the drain current Id2 flows through the second transistor 2a, and the voltage Vout of the output terminal 12 is lowered. When the voltage Vout of the output terminal 12 becomes lower than the gate voltage of the power transistor 99, the power transistor 99 switches from ON to OFF.

The operation of the drive unit 10c is the same as that of the drive unit 10a as shown in the time chart of FIG. 2. However, Vcm1 of FIG. 2 corresponds to [Vcg−Vf]. Like the drive unit 10a of the first embodiment, the drive unit 10c of the third embodiment can shorten the length of time from receiving of the drive signal Vin1 to driving of the power transistor 99, without increasing electric power consumption of the first transistor 1a. The provision of the diode 19, and the gate charge circuit 14b that satisfies the expression (2), afford this advantage to the drive unit 10c.

The gate charge circuit 14a of the drive unit 10b of the second embodiment as described above referring to FIG. 4 may be replaced with the gate charge circuit 14b using the diode 19.

In the drive unit 10c of the third embodiment, each parameter is set so as to satisfy the relationship of the above expression (4). However, when the relationship of the expression (4) is not satisfied, the gate voltage Vcm exceeds the gate threshold voltage Vth between time t3 and time t4 of FIG. 2, and the first transistor 1a and the second transistor 2a switch from OFF to ON. In this case, too, the first transistor 1a and the second transistor 2a can be switched in a shorter time, as compared with the case of FIG. 3 where no gate charge circuit is provided.

Fourth Embodiment

Figure 6:
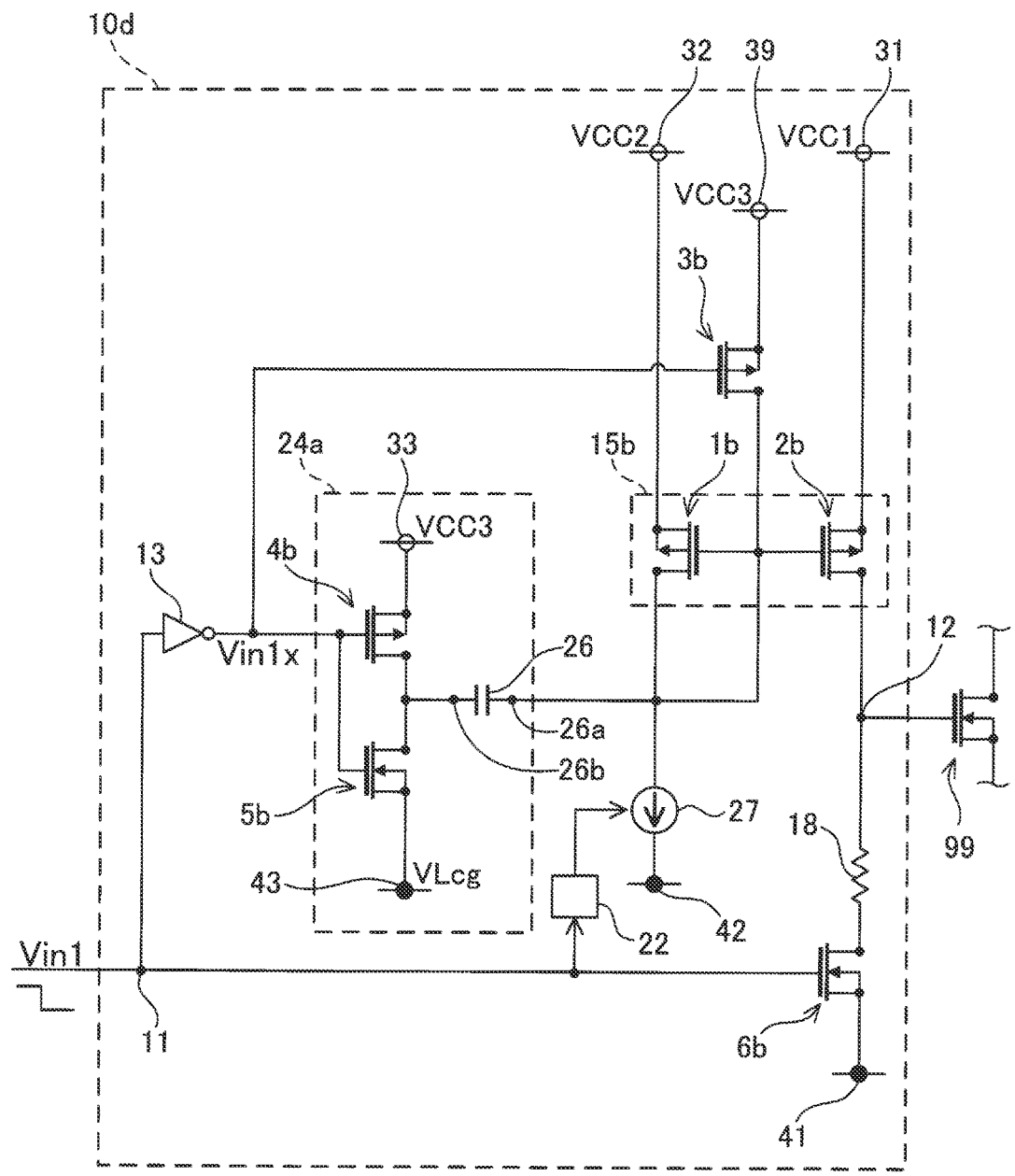
FIG. 6 is a block diagram of a drive unit of a fourth embodiment.
Figure 7:
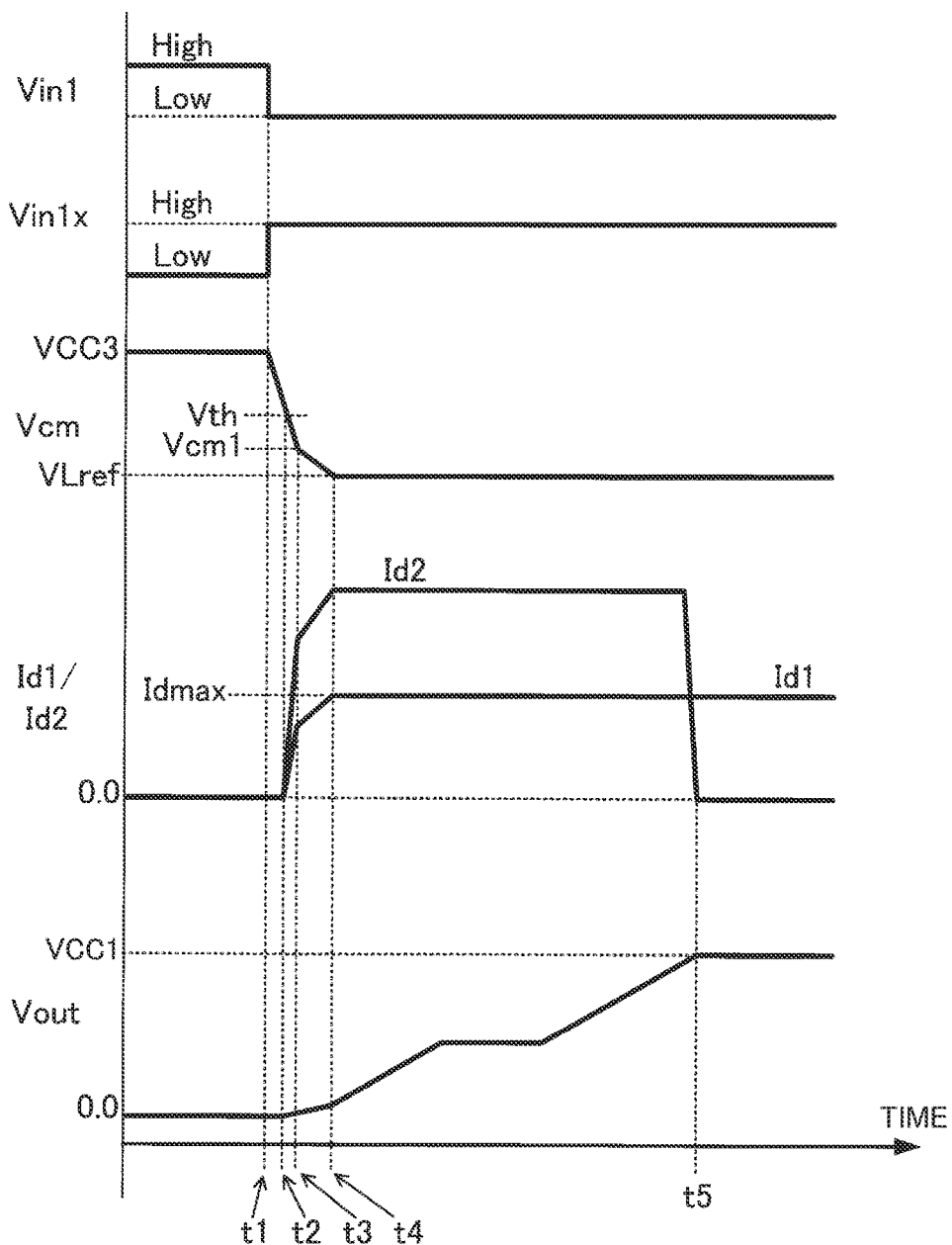
FIG. 7 is a time chart of the drive unit of the fourth embodiment.

Referring next to FIG. 6 and FIG. 7, a drive unit of a fourth embodiment will be described. FIG. 6 is a block diagram of the drive unit 10d of the fourth embodiment, and FIG. 7 is a time chart of the drive unit 10d. The drive unit 10d uses voltage-driven type P-channel transistors in its current mirror circuit. In the fourth embodiment to the sixth embodiment, a drive unit using voltage-driven type P-channel transistors in its current mirror circuit will be described.

The drive unit 10d switches the power transistor 99 between ON and OFF, using a pulse edge of the pulsed drive signal Vin1 as a trigger. The drive unit 10d holds the power transistor 99 in the OFF state when the drive signal Vin1 is at a high level (High in FIG. 7), and switches the power transistor 99 from OFF to ON when it receives the drive signal Vin1 that switches from the high level to a low level (Low in FIG. 7).

The drive unit 10d switches the first and second transistors 1b, 2b from OFF to ON, using a pulse edge at which the drive signal Vin1 switches from the high level to the low level, as a trigger, so that the power transistor 99 is switched from OFF to ON, as will be described in detail later. While a phrase "in response to the drive signal Vin1" often appears in the following description, this phase specifically means "in response to the drive signal Vin1, which is a drive, signal that switches the power transistor 99 (transistor to be driven) between ON and OFF, and switches the first and second transistors 1a, 2a from OFF to ON".

The drive unit 10d includes the input terminal 11 and the output terminal 12. A high-order control unit is connected to the input terminal 11, and the input terminal 11 receives the drive signal Vin1. The gate of the power transistor 99 to be driven is connected to the output terminal 12.

The drive unit 10d includes six transistors, i.e., a first transistor 1b through a sixth transistor 6b. The first transistor 1b, second transistor 2b, third transistor 3b, and the fourth transistor 4b are P-channel MOSFETs (Metal-Oxide Semiconductor Field Effect Transistors), and the fifth transistor 5b and the sixth transistor 6b are N-channel MOSFETs.

Some power-supply positive terminals 31, 32, 33, 39 and some power-supply negative terminals 41, 42, 43 are provided inside the drive unit 10d. The power-supply positive terminals 31, 32, 33, 39 are terminals that supply electric power to respective devices, and the power-supply negative terminals 41, 42, 43 correspond to discharge terminals of current that flows out of respective devices. The voltages of the power-supply positive terminals and power-supply negative terminals are determined by a power supply circuit (not shown). The power-supply negative terminals 41, 42, 43 may correspond to the ground terminal of the drive unit 10d, or may be held at voltages each obtained by adding a given bias to the voltage of the ground terminal of the drive unit 10d. The power-supply positive terminal 31 is held at the ON voltage VCC1 of the power transistor 99. The power-supply negative terminal 41 is held at the OFF voltage of the power transistor 99.

The drive unit 10d includes the NOT device 13 (inverter), current control circuit 22, capacitor 26, current source 27, and the resistor 18, in addition to the above-mentioned six transistors 1b-6b. The first transistor 1b and the second transistor 2b constitute a current mirror circuit 15b, and the fourth transistor 4b, fifth transistor 5b, and the capacitor 26 constitute a gate discharge circuit 24a.

The output terminal 12 of the drive unit 10d is connected to the power-supply negative terminal 41, via the resistor 18 and the sixth transistor 6b. The second transistor 2b is connected between the output terminal 12 and the power-supply positive terminal 31. The drain of the second transistor 2b is connected to the output terminal 12, and the source is connected to the power-supply positive terminal 31. When the sixth transistor 6b is turned off, and the second transistor 2b is turned on, the gate voltage of the power transistor 99 is raised to the voltage VCC1 of the power-supply positive terminal 31, and the power transistor 99 is turned on. When the sixth transistor 6b is turned on, and the second transistor 2b is turned off, the gate voltage of the power transistor 99 is lowered to the voltage of the power-supply negative terminal 41, and the power transistor 99 is turned off. The gate of the sixth transistor 6b is connected to the input terminal 11, and the sixth transistor 6b is switched between ON and OFF, according to the drive signal Vin1 received by the input terminal 11. The sixth transistor 6b function as a switch circuit for selectively allowing and inhibiting flow of current between the power-supply negative terminal 41 and the output terminal 12. (the gate of the power transistor 99). The sixth transistor 6b selectively allows and inhibits flow of current between the power-supply negative terminal 41 and the output terminal 12, in response to the drive signal Vin1 received by the input terminal 11. The sixth transistor 6b is quickly switched between ON and OFF, according to the drive signal Vin1. The length of time it takes from receiving of the drive signal Vin1 to driving of the power transistor 99 depends on operation of the current mirror circuit 15b.

The second transistor 2b and the first transistor 1b constitute the current mirror circuit 15b. The second transistor 2b is switched between ON and OFF, according to ON/OFF of the first transistor 1b. As described above, both of the first transistor 1*b* and the second transistor 2*b* are voltage-driven type P-channel transistors. Accordingly, current flow between the drain and the source is cut off (cutoff state) when the gate voltage is higher than a predetermined gate threshold voltage, and current is allowed to flow between the drain and the source (conducting state) when the gate voltage is lower than the gate threshold voltage. The source corresponds to a high-potential-side electrode, and the drain corresponds to a low-potential-side electrode. The drain of the first transistor 1*b* is connected to the gate. The source of the first transistor 1*b* is connected to the power-supply positive terminal 32. The gate of the first transistor 1*b* is connected to the gate of the second transistor 2*b*. As the first transistor 1*b* and the second transistor 2*b*, transistors having the same gate threshold voltage Vth are employed.

The drain of the third transistor 3*b* is connected to the gates of the first and second transistors 1*b*, 2*b*. The source of the third transistor 3*b* is connected to the power-supply positive terminal 39. The third transistor 3*b* is provided for charging the gates of the first and second transistors 1*b*, 2*b*. The gate of the third transistor 3*b* is connected to the input terminal 11 via the NOT device 13. Therefore, the gate of the third transistor 3*b* receives the inversion signal Vin1*x* of the drive signal Vin1. The third transistor 3*b* charges the gates of the first and second transistors 1*b*, 2*b*, in response to the drive signal Vin1 received by the input terminal 11.

The current source 27 is connected to the drain (low-potential-side electrode) of the first transistor 1*b*, and the power-supply negative terminal 42 is connected to the current source 27. The current source 27 is controlled by the current control circuit 22. The current control circuit 22 receives the drive signal Vin1. The current control circuit 22 switches the current source 27 from a current cutoff state to a conducting state, in response to the drive signal Vin1. As a result, gate discharge of the first and second transistors 1*b*, 2*b* is started. Namely, the current control circuit 22 starts gate discharge of the first and second transistors 1*b*, 2*b* using the current source 27 (through the current source 27), in response to the drive signal Vin1. The current source 27, when it is in the conducting state, limits the current discharged from the gates of the first transistor 1*b* and the second transistor 2*b* through the power-supply negative terminal 42, to a predetermined constant current (current upper-limit value Idmax). Immediately after the current source 27 switches from the cutoff state to the conducting state, the current that passes through the current source 27 and the voltage of its input terminal are gradually increased. The input terminal voltage of the current source 27 becomes equal to VLref when the first and second transistors 1*b*, 2*b* are ON, and current of the current upper-limit value Imax flows between the drain and source of the first transistor 1*b*.

The gate discharge circuit 24*a* is connected to the drain of the first transistor 1*b*, and the gates of the first and second transistors 1*b*, 2*b*. The gate discharge circuit 24*a* is a circuit that discharges the gates of the first and second transistors 1*b*, 2*b*, separately from the current source 27. The gate discharge circuit 24*a* consists of the power-supply positive terminal 33 to which a voltage VCC3 is supplied, power-supply negative terminal 43 that is held at a voltage VLcg, two transistors (the fourth transistor 4*b* and the fifth transistor 5*b*), and a capacitor 26. The voltage VLcg will be described later. The fourth and fifth transistors 4*b*, 5*b* are identical with the fourth and fifth transistors 4*a*, 5*a* of FIG. 1.

The gates of the fourth and fifth transistors 4*b*, 5*b* are both connected to the input terminal 11 via the NOT device 13. The gates of the fourth and fifth transistors 4*b*, 5*b* receive the inversion signal Vin1*x* of the drive signal Vin1. When the drive signal Vin1 is at a high level (High) (when the inversion signal Vin1*x* is at a low level (Low)), an electrode 26*b* of the capacitor 26 is connected to the power-supply positive terminal 33, and the capacitor 26 is charged. When the drive signal Vin1 is at a low level (Lou) (when the inversion signal Vin1*x* is at a high level (High)), the electrode 26*b* of the capacitor 26 is connected to the power-supply negative terminal 43, and the capacitor 26 is discharged. The fourth and fifth transistors 4*b*, 5*b* function as a switch for switching the destination to which the electrode 26*b* of the capacitor 26 is connected, from the power-supply positive terminal 33 to the power-supply negative terminal 43, in response to the drive signal Vin1. An electrode 26*a* of the capacitor 26 is connected to the gates of the first and second transistors 1*b*, 2*b*. Therefore, when the capacitor 26 is discharged, the gates of the first and second transistors 1*b*, 2*b* are also discharged.

The operation of the drive unit 10*d* will be generally described. Suppose the case where a pulse edge at which the drive signal Vin1 switches from the high level (High) to the low level (Low) is received. Before the drive signal Vin1 switches to the low level, the input terminal 11 is held at a high potential. At this time, the sixth transistor 6*b* is held in the ON state. Also, the current control circuit 22 holds the current source 27 in the current cutoff state. Namely the current control circuit 22 stops the current source 27, and keeps the connecting state between the first transistor 1*b* and the power-supply negative terminal 42 in the current cutoff state. The gates of the fourth and fifth transistors 4*b*, 5*b* of the gate discharge circuit 24*a* receive a low-level signal via the NOT device 13. Therefore, the electrode 26*b* of the capacitor 26 is connected to the power-supply positive terminal 33, and the capacitor 26 is held in the charged state. The gate of the P-channel third transistor 3*b* also receives the low-level signal via the NOT device 13. Therefore, the third transistor 3*b* is placed in the ON state, and the gates of the first and second transistors 1*b*, 2*b* are connected to the power-supply positive terminal 39. As a result, the gate voltage is raised, and the first and second transistors 1*b*, 2*b* are held in the OFF states. Since the second transistor 2*b* is held in the OFF state, and the sixth transistor 6*b* is held in the ON state, the output terminal 12 is held at the voltage of the power-supply negative terminal 41. Namely, the power transistor 99 is held in the OFF state.

The voltage of the power-supply positive terminal 33 of the gate discharge circuit 24*a* is the same as the voltage VCC3 of the power-supply positive terminal 39 that raises the gate voltage of the first and second transistors 1*b*, 2*b*. When the third transistor 3*b* and the fourth transistor 4*b* are both in the ON states, the gate voltage of the first and second transistors 1*b*, 2*b* is held at the ON voltage (voltage VCC3), owing to the power-supply positive terminals 39, 33.

The operation of the drive unit 10*d* when the drive signal Vin1 that switches from the high level to the low level is received will be described. Generally, when the drive signal Vin1 switches to the low level, the sixth transistor 6*b* is turned off, and the second transistor 2*b* is turned on. As a result, the potential of the output terminal 12 is raised to the voltage VCC1 of the power-supply positive terminal 31, and the power transistor 99 is switched from OFF to ON.

The operation of the drive unit 10*d* when the drive signal Vin1 that switches from the high level (High) to the low level (Low) is received will be specifically described. When the drive signal Vin1 switches from the high level to the low level, the third transistor 3*b* is turned off, and current flow between the gates of the first and second transistors 1*b*, 2*b* of the current mirror circuit 15b and the power-supply positive terminal 39 is cut off. At the same time, the current control circuit 22 turns the current source 27 into the conducting state in response to the drive signal Vin1, so that electric power starts being discharged from the first transistor 1b to the power-supply negative terminal 42. Since the first transistor 1b is OFF at first, the drain and the source are disconnected from each other. Therefore, electric power is discharged from the gates of the first and second transistors 1b, 2b through the current source 27. Namely, the current control circuit 22 starts gate discharge of the first and second transistors 1b, 2b using the current source 27 (through the current source 27), in response to the drive signal Vin1.

At the same time as switching by the current control circuit 22, the destination to which the capacitor 26 of the gate discharge circuit 24a is connected is switched from the power-supply positive terminal 33 to the power-supply negative terminal 43, in response to the drive signal Vin1, and the gates of the first and second transistors 1b, 2b are also discharged through the capacitor 26. The gate discharge circuit 24a discharges the gates of the first and second transistors 1b, 2b, without involving the current source 27. The gates of the first and second transistors 1b, 2b are rapidly discharged through both of the current source 27 and the gate discharge circuit 24a. Therefore, the gate voltage of the first and second transistors 1b, 2b is rapidly reduced, and the first and second transistors 1b, 2b switch from OFF to ON. Since the second transistor 2b is turned on, and the sixth transistor 6b is turned off, the potential of the output terminal 12 is raised to the voltage VCC1 of the power-supply positive terminal 31, and the power transistor 99 is switched from OFF to ON. Namely, the drive unit 10b switches the power transistor 99, in response to the pulsed drive signal Vin1 from a high-order control unit.

On the other hand, when the drive signal Vin1 switches from the low level to the high level, the voltage of the output terminal 12 of the drive unit 10b is lowered to the potential of the power-supply negative terminal 41, and the power transistor 99 is switched from ON to OFF. The operation of the drive unit 10d when the potential of the output terminal 12 switches from the high potential to the low potential will not be described.

The gate discharge circuit 24a automatically stops discharge before the drain current of the first transistor 1a reaches the current upper-limit value Idmax. This is achieved when the first transistor 1a is ON, and the input terminal voltage VLref of the current source 27 when current of the current upper-limit value Idmax flows between the drain and source of the first transistor 1b, the capacitance Ccg of the capacitor 26, the total capacitance Ccm of the gate capacitances of the first and second transistors 1b, 2b, and a voltage difference dVcg between the power-supply positive terminal 39 that supplies electric power to the gates of the first and second transistors 1b, 2b, and the power-supply negative terminal 43, satisfy the relationship of the following expression (5).

$$dVcg \cdot Ccm/(Ccg+Ccm) \geq Vref \quad (5)$$

The power-supply positive terminal 39 is a high voltage terminal for supplying electric power to the gates of the first and second transistors 1b, 2b. Where VCC3 denotes the voltage of the power-supply positive terminal 39, and VLcg denotes the voltage of the power-supply negative terminal 43, dVcg is expressed as follows: dVcg=VCC3−VLcg.

In the above expression (5), "dVcg·Ccm/(Ccg+Ccm)" means a voltage that is developed at the electrode 26a of the capacitor 26 closer to the current mirror circuit 15b, due to the voltage difference dVcg between the power-supply positive terminal 39 and the power-supply negative terminal 43. In other words, "dVcg·Ccm/(Ccg+Ccm)" corresponds to the gate voltage Vcm of the first and second transistors 1b, 2b, which is achieved by the voltage difference dVcg.

As described above, the current source 27 and the gate discharge circuit 24a start releasing electric power from the gates of the first and second transistors 1b, 2b (namely, start discharging the gates), in response to the drive signal Vin1. As the discharge starts, the gate voltage Vcm of the first and second transistors 1b, 2b is lowered. The gates of the first and second transistors 1b, 2b are discharged through both the current source 27 and the gate discharge circuit 24a, until the gate voltage Vcm is lowered to "dVcg·Ccm/(Ccg+Ccm)". When the gate voltage Vcm becomes lower than "dVcg·Ccm/(Ccg+Ccm)", current cannot be discharged from the gate discharge circuit 24a, and discharge through the gate discharge circuit 24a is stopped. Since the lowest voltage VLref of the input terminal of the current source 27 is lower than "dVcg·Ccm/(Ccg+Ccm)", discharge through the current source 27 continues. Finally, the gate voltage Vcm becomes equal to VLref. The lowest voltage VLref of the input terminal of the current source 27 will be described later.

The lowest voltage VLref of the input terminal of the current source 27 is set to a lower level than the gate threshold voltage Vth. When the gate voltage Vcm of the first and second transistors 1b, 2b becomes lower than the gate threshold voltage Vth, the first and second transistors 1b, 2b switch from OFF to ON at the same time. When the first transistor 1b is turned on, current (drain current) flows between the drain and source of the first transistor 1b. As described above, the current discharged from the first transistor 1b does not exceed the magnitude of "Idmax"; therefore, the first transistor 1b is only required to have a size (channel width) large enough to permit the current upper-limit value Idmax. The lowest voltage VLref of the input terminal of the current source 27 corresponds to the input terminal voltage of the current source 27 when the first and second transistors 1b, 2b are ON, and the current of the current upper-limit value Idmax flows between the drain and source of the first transistor 1b.

The drive unit 10d includes the gate discharge circuit 24a for discharging the gates of the first and second transistors 1b, 2b, aside from the power-supply negative terminal 42 and the current source 27. Immediately after the drive unit 10d receives the drive signal Vin1 as a command for switching of the power transistor 99, the gates of the first and second transistors 1b, 2b are discharged by both the current source 27 and the gate discharge circuit 24a. Therefore, the length of time it takes from the time when the drive signal Vin1 is received to the time when the first and second transistors 1b, 2b switch from OFF to ON is shortened. Also, the gate discharge circuit 24a is stopped by the time when the current (drain current) that flows between the drain and source of the first transistor 1b reaches the current upper-limit value Idmax. The gate discharge circuit 24a that satisfies the above expression (5) makes it possible to shorten the time from receiving of the drive signal Vin1 to driving of the power transistor 99, while limiting the current (drain current) that constantly flows between the drain and source of the first transistor 1b to the current upper-limit value Idmax or smaller.

Referring to the time chart of FIG. 7, the operation of the drive unit 10d will be described again. Symbols Vin1, Vin1x, Vcm, Id1, Id2, and Vout have the same meanings as those in the case of FIG. 2.

The drive signal Vin1 changes from a high level (High) to a low level (Low) at time t1. The inversion signal Vin1*x* changes from the low level (Low) to the high level (High) at time t1. As described above, when the drive signal Vin1 changes from the high level to the low level, the third transistor 3*b* and the sixth transistor 6*b* are both switched from ON to OFF.

If the inversion signal Vin1*x* switches from the low level to the high level, the current control circuit 22 switches the current source 27 from the current cutoff state to the conducting state, and discharge through the current source 27 is started. At the same time, the destination to which the electrode 26*b* of the capacitor 26 is connected switches from the power-supply positive terminal 33 to the power-supply negative terminal 43, and discharge through the gate discharge circuit 24*a* is also started. With electric power thus discharged through both the current source 27 and the gate discharge circuit 24*a*, the gate voltage Vcm is rapidly lowered. The total capacitance Ccm of the gate capacitance of the first transistor 1*b* and the gate capacitance of the second transistor 2*b*, voltage difference dVcg between the power-supply positive terminal 39 and the power-supply negative terminal 43, and the gate threshold voltage Vth of the first transistor 1*b* and the second transistor 2*b*, are determined so as to satisfy the relationship of the following expression (7).

$$Vth \geq dVcg \cdot Ccm/(Ccg+Ccm) \quad (7)$$

As described above, [dVcg·Ccm/(Ccg+Ccm)] is the gate voltage Vcm realized by the voltage difference dVcg. In FIG. 7, the voltage Vcm1 corresponds to [dVcg·Ccm/(Ccg+Ccm)]. Since the gate threshold voltage Vth is higher than the voltage Vcm1, the first and second transistors 1*b*, 2*b* switch from OFF to ON while electric power is kept discharged from the gate discharge circuit 24*a*. At time t2, the gate voltage Vcm becomes lower than the gate threshold voltage Vth, and the first transistor 1*b* and the second transistor 2*b* switch from OFF to ON. Accordingly, the drain currents Id1, Id2 start flowing from time t2, and the voltage Vout of the output terminal 12 starts rising.

At time t3, the gate voltage Vcm reaches the voltage Vcm1. At time t3, the gate discharge circuit 24*a* becomes unable to discharge electric power from the first transistor 1*b* to the power-supply negative terminal 43 through the capacitor 26. Namely, the discharge through the gate discharge circuit 24*a* is automatically stopped, at a point in time at which the gate voltage Vcm reaches the voltage Vcm1. After time t3, only the discharge through the current source 27 is continued. Therefore, after time t3, the rate of increase of the drain current Id1 of the first transistor 1*b* is reduced. At time t4, the drain current Id1 reaches the current upper-limit value Idmax of the current source 27. After time t4, the drain current Id1 of the current upper-limit value Idmax keeps flowing through the first transistor 1*b*. After time t2, drain current Id2, which is obtained by multiplying the drain current Id1 of the first transistor 1*b* by [M2/M1], flows through the second transistor 21. The drain current Id2 of the second transistor 2*b* flows from the power-supply positive terminal 31 into the gate of the power transistor 99. As the drain current Id2 flows through the second transistor 2*b*, the gate voltage of the power transistor 99, namely, the voltage of the output terminal 12 (output terminal voltage Vout), rises. When a potential difference between the power-supply positive terminal 31 and the output terminal voltage Vout becomes too small to cause current of Id2=Id1×(M2/M1) to flow, the drain current Id2 of the second transistor 2*a* is reduced, and the drain current Id2 becomes equal to zero at time t5. At this time, the output terminal voltage Vout becomes equal to the voltage VCC1 of the power-supply positive terminal 31. Between time t4 and time t5, the power transistor 99 switches from OFF to ON when the output terminal voltage Vout exceeds the gate threshold voltage of the power transistor 99.

After time t4, the gate voltage Vcm is equal to the input terminal voltage VLref of the current source 27 at the time when current of the current upper-limit value Idmax flows between the drain and source of the first transistor 1*b*.

When the gate discharge circuit 24*a* is not provided, there is no period, like the period between time t1 and time t3 in the time chart of FIG. 7, in which the gate voltage Vcm is rapidly lowered. When the gate discharge circuit 24*a* is not provided, the rate of reduction of the gate voltage Vcm between time t3 and time t4 of FIG. 7 starts from time t1. Therefore, when the gate discharge circuit 24*a* is not provided, the time at which the gate voltage Vcm becomes lower than the gate threshold voltage Vth is later than that in the case of FIG. 7. Meanwhile, the gate discharge circuit 24*a* does not increase the drain current of the first transistor 1*b*. Accordingly, the drive unit 10*d* including the gate discharge circuit 24*a* can shorten the length of time from receiving of the drive signal Vin1 to driving of the power transistor 99, without increasing the drain current of the first transistor 1*b* of the current mirror circuit 15*b*.

In the drive unit 10*d* of the fourth embodiment, when, the drive signal vial switches from the high level to the low level, discharge through the current source 27 is started, and the gate discharge circuit 24 also starts discharging. When the amount of discharge of the gate discharge circuit 24*a* per unit time is larger than the amount of discharge of the current source 27 per unit time, a given time difference may be provided between start of discharge of the gate discharge circuit 24*a* and start of discharge through the current source 27. For example, the gate discharge circuit 24*a* starts discharging, immediately after switching of the drive signal Vin1 from the high level to the low level, and the current control circuit 22 switches the current source 27 from the cutoff state to the conducting state, and starts discharging, after waiting for the given time difference after switching of the drive signal Vin1. The time difference is, for example, time it takes the gate voltage Vcm to reach the lowest voltage Vcm1=[dVcg·Ccm/(Ccg+Ccm)] owing to the gate discharge circuit 24*a*.

Fifth Embodiment

Figure 8:
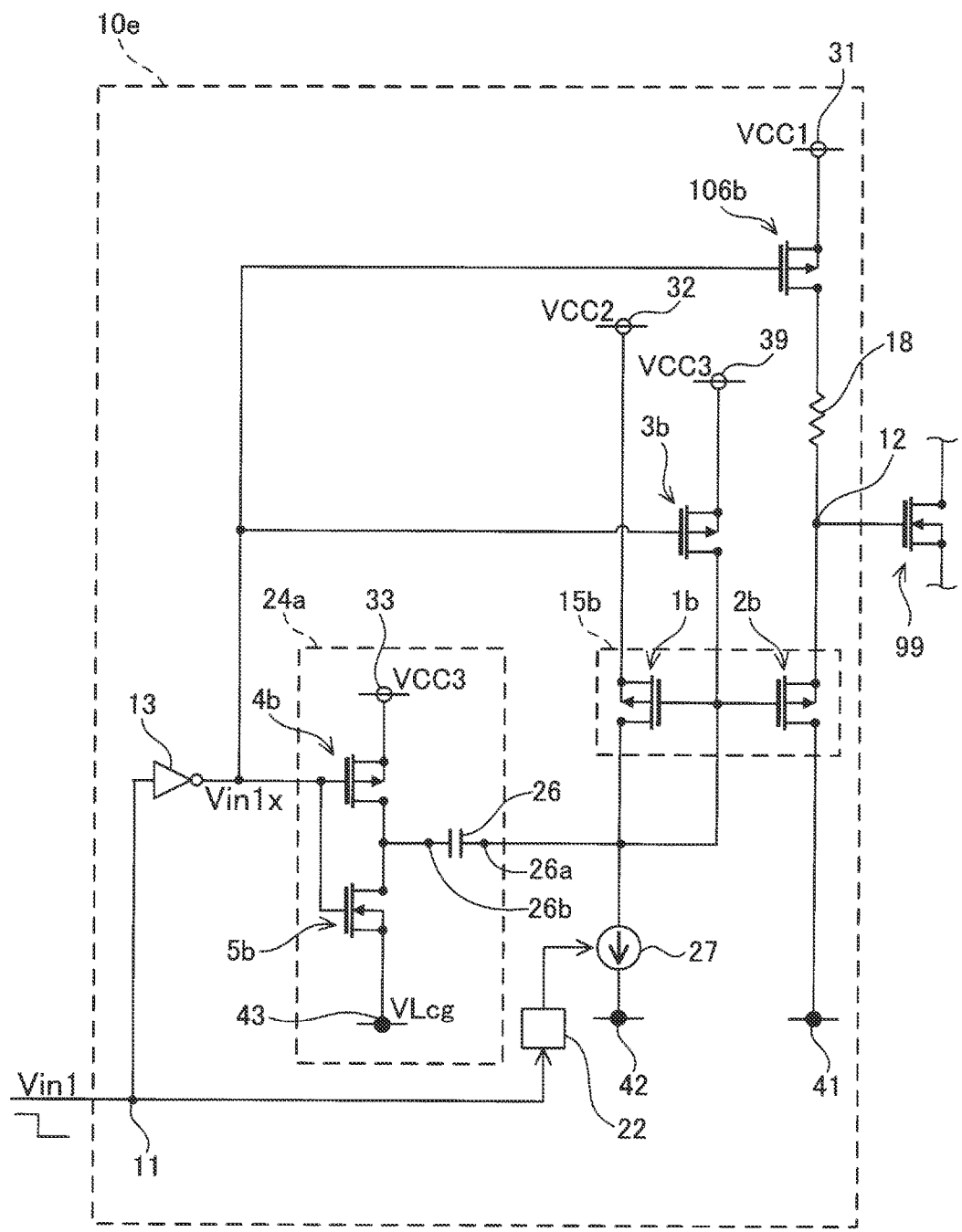
FIG. 8 is a block diagram of a drive unit of a fifth embodiment.

Referring to FIG. 8, a fifth embodiment will be described. A drive unit 10*b* of the fifth embodiment also employs voltage-driven type P-channel transistors in its current mirror circuit. In the drive unit 10*d* of the fourth embodiment, the second transistor 2*b* is connected between the power-supply positive terminal 31 and the output terminal 12, and the resistor 18 and the sixth transistor 6*b* are connected between the output terminal 12 and the power-supply negative terminal 41. In the drive unit 10*e* of the fifth embodiment, the resistor 18 and a sixth transistor 106l are connected between the power-supply positive terminal 31 and the output terminal 12, and the second transistor 2*b* of the current mirror circuit 15*b* is connected between the output terminal 12 and the power-supply negative terminal 41. The gate of the sixth transistor 106*b* is connected to the NOT device 13, and the inversion signal Vin1*x* is transmitted to the gate of the sixth, transistor 106*b*. The power-supply positive terminal 32 is controlled to be at the same voltage as the output terminal 12.

When the drive unit 10e receives a drive signal Vin1 that switches from a high level (High) to a low level (Low), the sixth transistor 106b switches from ON to OFF, and the second transistor 2b switches from OFF to ON. As a result, the potential of the output terminal 12 is lowered from the potential of the power-supply positive terminal 31 to the potential of the power-supply negative terminal 41, and the power transistor 99 switches from ON to OFF.

The functions of the current mirror circuit 15b, gate discharge circuit 24b, current control circuit 22, and the current source 27 in the drive unit 10e of FIG. 8 are the same as those of the drive unit 10d of the fourth embodiment, and therefore, will not be described in detail. In the drive unit 10d of the fourth embodiment of FIG. 6, the second transistor 2b of the current Mirror circuit 15b is connected between the output terminal 12 and the power-supply positive terminal 31. In the drive unit 10e of the fifth embodiment, the second transistor 2b is connected between the power-supply negative terminal 41 and the output terminal 12. However, the function and effect of the gate discharge circuit 24a are identical with those in the case of the drive unit 10d of FIG. 6. Like the drive unit 10d of FIG. 6, the drive unit 10e of FIG. 8 can shorten the length of time from receiving of the drive signal Vin1 to driving of the power transistor 99, while suppressing or reducing electric power consumption.

A point to note in connection with the fourth and fifth embodiments will be described. In the drive unit 10d of the fourth embodiment, each parameter is set so that the relationship of the above expression (7) is satisfied. When the relationship of the expression (7) is not satisfied, the gate voltage Vcm becomes lower than the gate threshold voltage Vth at a point in time between time t3 and time t4 in FIG. 7, and the first transistor 1b and the second transistor 2b switch from OFF to ON. In this case, too, the first and second transistors 1b, 2b can be switched in a shorter time, as compared with the case where no gate charge circuit is provided. The same point to note is applied to the fifth embodiment.

Sixth Embodiment

Figure 9:
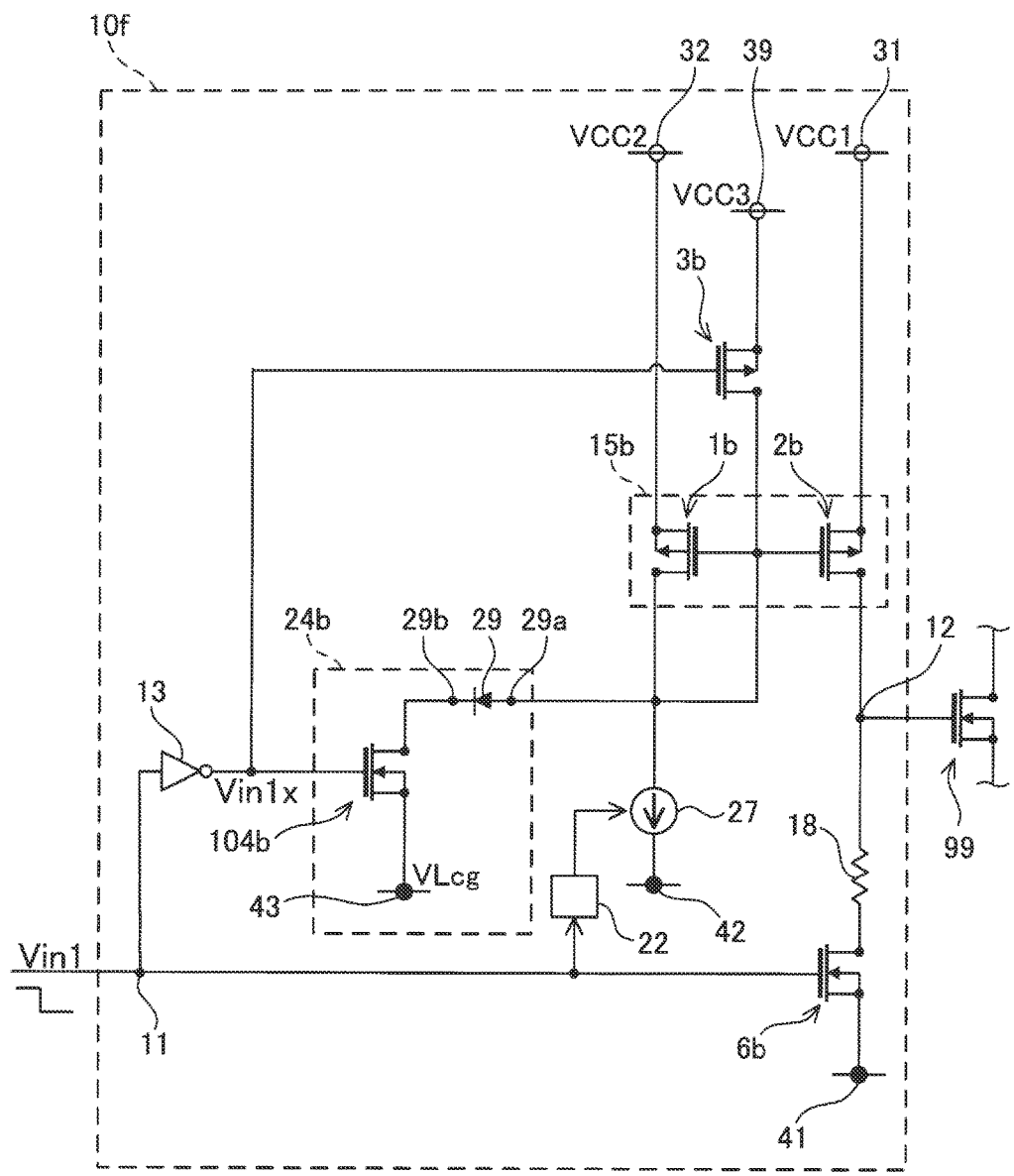
FIG. 9 is a block diagram of a drive unit of a sixth embodiment.

Referring to FIG. 9, a drive unit 10f of a sixth embodiment will be described. The drive unit 10f of the sixth embodiment also employs voltage-driven type P-channel transistors in its current mirror circuit. The drive unit 10f of the sixth embodiment has a gate discharge circuit 24b that is different from the gate discharge circuit 24a of the drive unit 10d of the fourth embodiment. In the block diagram of FIG. 9, the devices other than the gate discharge circuit 24b are identical with the devices shown in the block diagram of FIG. 6, and therefore, will not be described.

Like the gate discharge circuit 24a of the fourth embodiment, the gate discharge circuit 24b is connected to the drain and gate of the first transistor 1b, and the gate of the second transistor 2b. The gate discharge circuit 24b consists of the power-supply negative terminal 43 that is held at voltage VLcg, voltage-driven type N-channel fourth transistor 104b, and a diode 29. An anode 29a of the diode 29 is connected to the drain and gate of the first transistor 1b, and the gate of the second transistor 2b. A cathode 29b of the diode 29 is connected to the power-supply negative terminal 43 via the fourth transistor 104b. The gate of the fourth transistor 104b is connected to the input terminal 11 via the NOT device 13. Namely, the fourth transistor 104b functions as a switch for switching the connecting state between the power-supply negative terminal 43 and the first and second transistors 1b, 2b from the cutoff state to the conducting state, in response to the drive signal Vin1.

The input terminal voltage VLref of the current source 27 when the first transistor 1b is ON, and current of the current upper-limit value Idmax flows between the drain and source of the first transistor 1b through the current source 27, forward voltage Vf of the diode 29, and the voltage VLcg of the power-supply negative terminal 43 are determined so as to satisfy the relationship of the following expression (6).

$$VLcg + Vf \geq VLref \tag{6}$$

The power-supply negative terminal 43 is a low-voltage terminal for discharging the gates of the first and second transistors 1b, 2b in the gate discharge circuit 24b. The left side of the above expression (6) means the lowest voltage of the gate voltage Vcm when the current source 27 is in the cutoff state. Also, the forward voltage Vg, voltage VLcg of the power-supply negative terminal 43, and the gate threshold voltage Vth of the first and second transistors 1a, 2a are determined so as to satisfy the following expression (8).

$$Vth \geq VLcg + Vf \tag{8}$$

Like the drive unit 10d of the fourth embodiment, the drive writ 10f switches the power transistor 99 from OFF to ON, when the potential of the pulsed drive signal Vin1 received by the input terminal 11 switches from a high level (High) to a low level (Low). The operation of the drive unit 10f mainly, that of the gate discharge circuit 24b, will be described.

When the drive signal Vin1 switches from the high level to the low level, the current control circuit 22 switches the current source 27 connected between the power-supply negative terminal 42 and the first transistor 1b, from the cutoff state to the conducting state. As a result, gate discharge of the first and second transistors 1b, 2b through the current source 27 is started. At the same time, the fourth transistor 104b switches from OFF to ON, in response to the inversion signal Vin1x of the drive signal Vin1, and the connecting state between the power-supply negative terminal 43 and the first and second transistors 1b, 2b switches from the cutoff state to the conducting state. The gate discharge circuit 24b discharges the gates of the first and second transistors 1b, 2b without involving the current source 27. The gates of the first and second transistors 1b, 2b are discharged through both of the gate discharge circuit 24b and the current source 27, until the gate voltage Vcm of the first and second transistors 1b, 2b is reduced to [VLcg+Vf]. As a result, the gate voltage Vent rapidly drops. When the gate voltage Vcm reaches [VLcg+Vf], discharge through the gate discharge circuit 24b is automatically stopped. According to the expression (8), the first and second transistors 1b, 2b switch from OFF to ON by the time when the gate voltage Vcm reaches [VLcg+Vf]. As a result, the drain current starts flowing through the first and second transistors 1b, 2b.

According to the relationship of the expression (6), electric power continues to be discharged through the current source 27 even after the gate voltage Vcm reaches [VLcg+Vf]. When the gate voltage Vcm becomes lower than [VLcg+Vf], the diode 29 prevents counter now of current from the power-supply negative terminal 43 to the gates of the first and second transistors 1b, 2b. Accordingly, the gate voltage Vcm drops to be lower than [VLcg+Vf], by discharge through the power-supply negative terminal 42 and the current source 27.

After the gate voltage Vcm becomes lower than [VLcg+Vf], the gate voltage Vcm drops down to the voltage VLref, by discharge through the current source 27, and the drain current Id1 flowing through the first transistor 1b increases up to the current upper-limit value Idmax. Thereafter, the gate voltage Vcm is kept at the voltage VLref, and the current of the current upper-limit value Idmax keeps flowing through the first transistor 1b.

When the second transistor 2b, as well as the first transistor 1b, switches from OFF to ON, the drain current Id2 flows through the second transistor 2b, and the voltage Vout of the output terminal 12 rises. When the voltage Vout of the output terminal 12 exceeds the gate voltage of the power transistor 99, the power transistor 99 switches from OFF to ON.

The operation of the drive unit 10f is identical with that of the drive unit 10d shown in the time chart of FIG. 7. It is, however, to be noted that Vcm1 of FIG. 7 corresponds to [VLcg+Vf]. Like the drive unit 10d of the fourth embodiment, the drive unit 10f of the sixth embodiment can shorten the length of time from receiving of the drive signal to driving of the power transistor 99, without increasing the electric power consumption of the first transistor 1b.

The gate discharge circuit 24a of the drive unit 10e of the fifth embodiment as described above referring to FIG. 8 may be replaced with the gate discharge circuit 24b using the diode 29.

In the drive unit 10f of the sixth embodiment, each parameter is set so as to satisfy the relationship of the above expression (8). However, when the relationship of the expression (8) is not satisfied, the gate voltage Vcm becomes lower than the gate threshold voltage Vth at a point in time between time t3 and time t4 of FIG. 7, and the first transistor 1a and the second transistor 2a switch from OFF to ON. In this case, too, the first transistor 1a and the second transistor 2a can be switched in a shorter time, as compared with the case where no gate charge circuit is provided.

Seventh Embodiment

Figure 10:
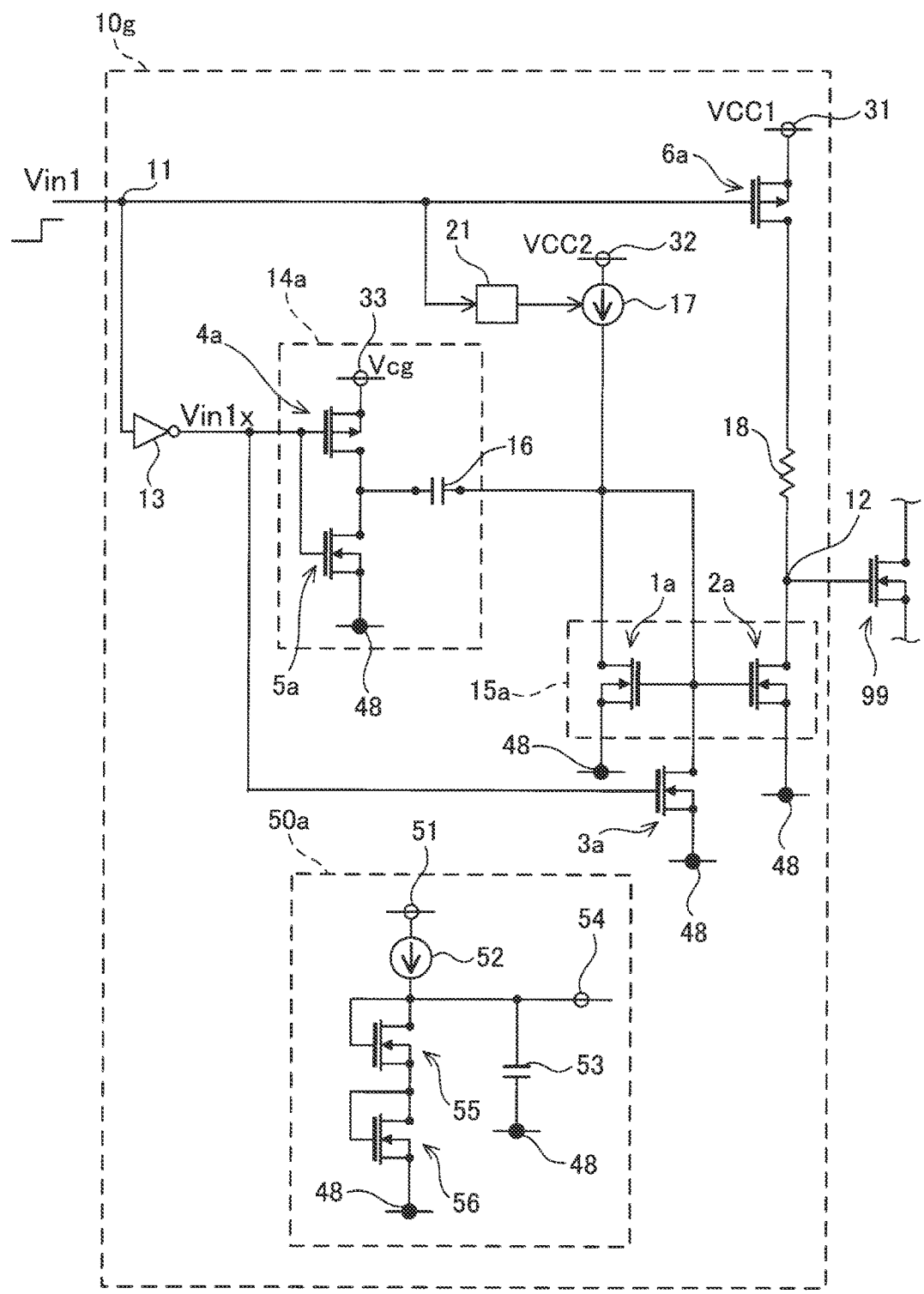
FIG. 10 is a block diagram of a drive unit of a seventh embodiment.
Figure 11:
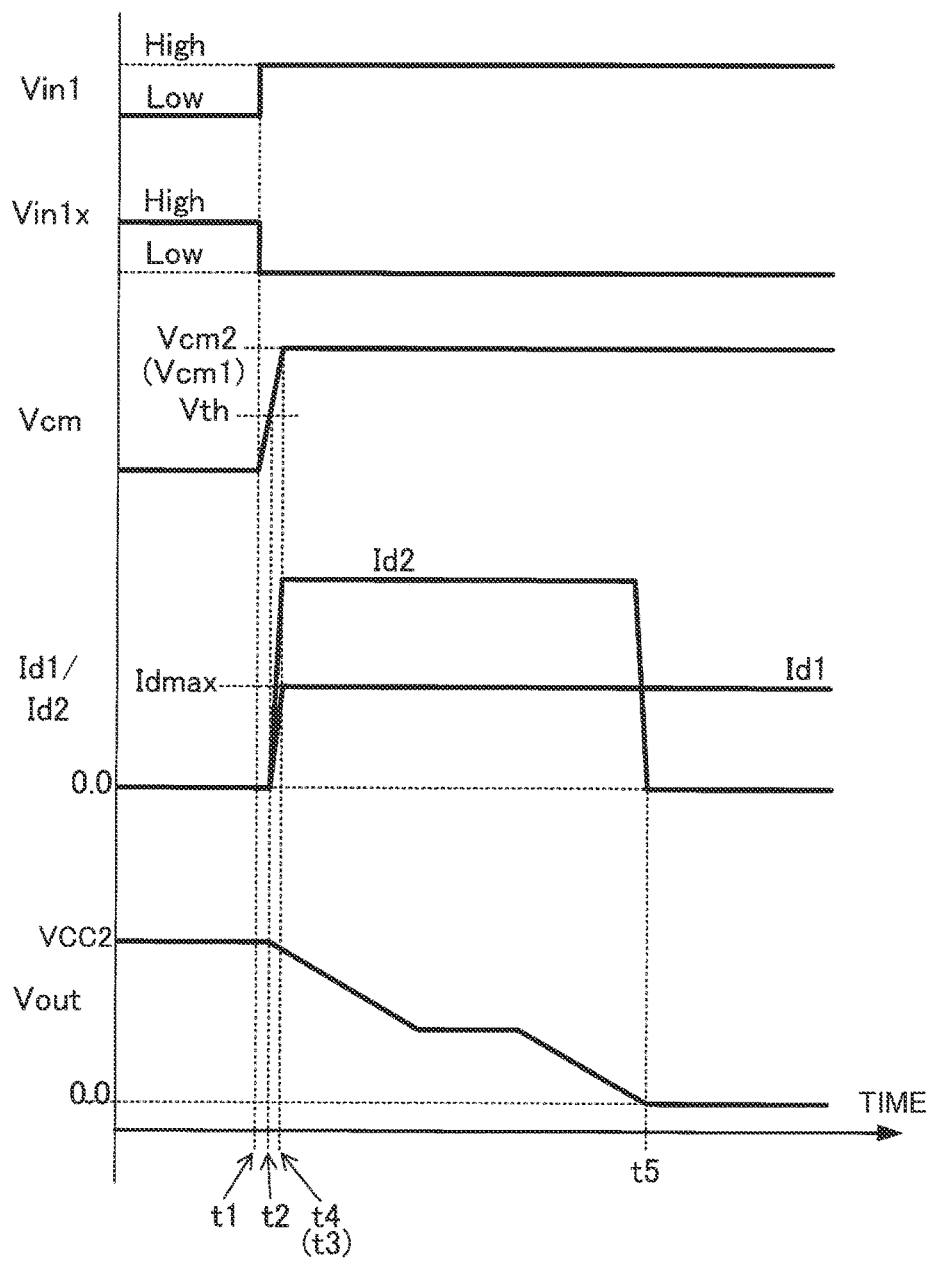
FIG. 11 is a time chart of the drive unit of the seventh embodiment.

Referring next to FIG. 10 and FIG. 11, a drive unit 10g of a seventh embodiment will be described. FIG. 10 is a block diagram of the drive unit 10g, and FIG. 11 is a time chart of the drive unit 10g. The drive unit 10g includes a current mirror circuit using voltage-driven type N-channel transistors.

The drive unit 10g includes a voltage adjustment circuit 50a for appropriately adjusting the voltage Vcg of the power-supply positive terminal 33 of the gate charge circuit 14a, in the drive unit 10a of the first embodiment. A voltage output terminal 54 of the voltage adjustment circuit 50a is connected to the power-supply positive terminal 33 of the gate charge circuit 14a. In FIG. 10, a line that connects the voltage output terminal 54 with the power-supply positive terminal 33 is not depicted, for the sake of convenience.

In the drive unit 10g, the circuit other than the voltage adjustment circuit 50a is identical with the circuit shown in FIG. 1, and therefore, will not be described. However, in this embodiment, all of the power-supply negative terminals 41-42, 43, 49 of the circuit of FIG. 1 are held at the same potential (the ground potential of the drive unit 10g); therefore, in this embodiment, the power-supply negative terminals 41, 42, 43, 49 in FIG. 1 will be collectively called "common ground terminal 48". In the following, the voltage adjustment circuit 50a will be described.

The voltage adjustment circuit 50a includes a power-supply positive terminal 51, current source 52, filter capacitor 53, and voltage-driven type N-channel transistors 55, 56. Here, transistors having the same characteristics as the first transistor 1a of the current mirror circuit 15a are employed as the transistors 55, 56. Also, the current source 52 has the same characteristics as the current source 17, and operates with the same current upper-limit value Idmax and the same output terminal voltage Vref as the current source 17. Also, as the capacitor 16 of the gate charge circuit 14a, a capacitor of which the capacitance Ccg is equal to the total capacitance Ccm of the gate capacitance of the first transistor 1a and the gate capacitance of the second transistor 2a is employed.

The transistors 55, 56 are connected in series between the power-supply positive terminal 51 and the common ground terminal 48. The gate and drain of the transistor 55 are connected to each other, and the gate and drain of the transistor 56 are also connected to each other. A given voltage is applied to the power-supply positive terminal 51. For example, the voltage applied to the power-supply positive terminal 51 may be the same as the voltage VCC2 of the power-supply positive terminal 32 that supplies electric power to the first transistor 1a. The current source 52 is connected between the high-potential-side transistor 55 and the power-supply positive terminal 51. The drain of the high-potential-side transistor 55 is connected to the voltage output terminal 54 of the voltage adjustment circuit 50a. The filter capacitor 53 that suppresses or reduces voltage fluctuations of the voltage output terminal 54 is connected between the voltage output terminal 54 and the common ground terminal 48.

As explained above in the description of the drive unit 10a of the first embodiment, the gate voltage Vcm developed by the voltage Vcg of the power-supply positive terminal 33 is expressed as Vcm=[Vcg×Ccg/(Ccg+Ccm)], where Ccg denotes the capacitance of the capacitor 16. Here, the capacitance Ccg of the capacitor 16 is selected to be equal to the total capacitance Ccm of the gates. Therefore, Vcm is equal to Vcg/2, (Vcm=Vcg/2).

In the meantime, in the voltage adjustment circuit 50a, Vcg is equal to $V_{55}+V_{56}$ (Vcg=$V_{55}+V_{56}$), where symbol $V_{55}$ denotes the gate voltage of the transistor 55, and symbol $V_{56}$ denotes the gate voltage of the transistor 56. Since first transistor 1a, transistor 55, and the transistor 56 have the same characteristics, and the same magnitude of current flows through these transistors, Vgs=$V_{55}$=$V_{56}$. Here, Vgs denotes a target ON voltage of the first transistor 1a. The target ON voltage is the gate voltage for holding the first transistor 1a in the ON state, and the output terminal voltage Vref of the current source 17 at the time when the gate voltage causes current of the current upper-limit value Idmax to flow between the drain and source of the first transistor 1a corresponds to the target ON voltage Vgs.

It follows from the above relationships that Vcm=Vcg/2=($V_{55}+V_{56}$)/2=2Vgs/2=Vgs. On the other hand, the output voltage Vref of the current source 17 at the time when current of the current upper-limit value Idmax flows between the drain and source of the first transistor 1a corresponds to the target ON voltage Vgs of the first transistor 1a, as stated above. Namely, when the gate charge circuit 14a is operated, using the voltage adjustment circuit 50a, the gate charge circuit 14a raises the gate voltage Vcm of the first and second transistors 1a, 2a to the target ON voltage Vgs, i.e., to the output terminal voltage Vref of the current source 17. FIG. 11 shows a time chart of the drive unit 10g of FIG. 10. At time t1 the drive signal Vin1 switches from a low level (Low) to a high level (High), and the gate charge circuit 14a and the current source 17 start supplying electric power. With the power supplied from the gate charge circuit 14a, the gate voltage Vcm of the first and second transistors 1a, 2a is raised straight to Vref (Vcm2). In the time chart of FIG. 2 as described above, the gate voltage Vcm reaches the maximum output voltage Vcm1 (=Vcg·Ccg/(Ccg+Ccm)) of the gate charge circuit 14a at time t3 in FIG. 2. In the drive unit 10g of FIG. 10, the maximum output voltage Vcm1 of the gate charge circuit 14a is adjusted to be equal to the voltage Vref. Thus, in the time chart of FIG. 11, time t3 and time t4 in the time chart of FIG. 2 become the same point in time. At time t4 in FIG. 2, the gate voltage Vcm reaches Vcm2, i.e., the output terminal voltage Vref of the current source 17. In the drive unit 10g of FIG. 10, the output voltage of the gate charge circuit 14a is optimally adjusted; therefore, the gate voltage Vin1 of the first and second transistors 1a, 2a is raised straight to the target ON voltage (voltage Vref). Therefore, the length of time it takes until the voltage Vout of the output terminal 12 is lowered down to zero can be further shortened. Namely the drive unit 10g of FIG. 10 makes it possible to further shorten the time from receiving of the drive signal Vin1 to driving of the power transistor 99.

The seventh embodiment corresponds to the case where the above expression (1) in which the equal sign is used is satisfied. In the drive unit 10g, the gate charge circuit 14a stops charging at a point in time at which the gate voltage Vcm reaches the output terminal voltage Vref of the current source 17. In the drive unit 10g of the seventh embodiment, the voltage of the voltage output terminal 54 (namely, the voltage Vcg of the power-supply positive terminal 33 of the gate charge circuit 14a) is determined based on the voltage of the common ground terminal 48. Therefore, even if the voltage of the power-supply positive terminal 51 fluctuates, the gate charge circuit 14a always stops charging at the time when the gate voltage Vcm reaches the output terminal voltage Vref of the current source 17.

Eighth Embodiment

Figure 12:
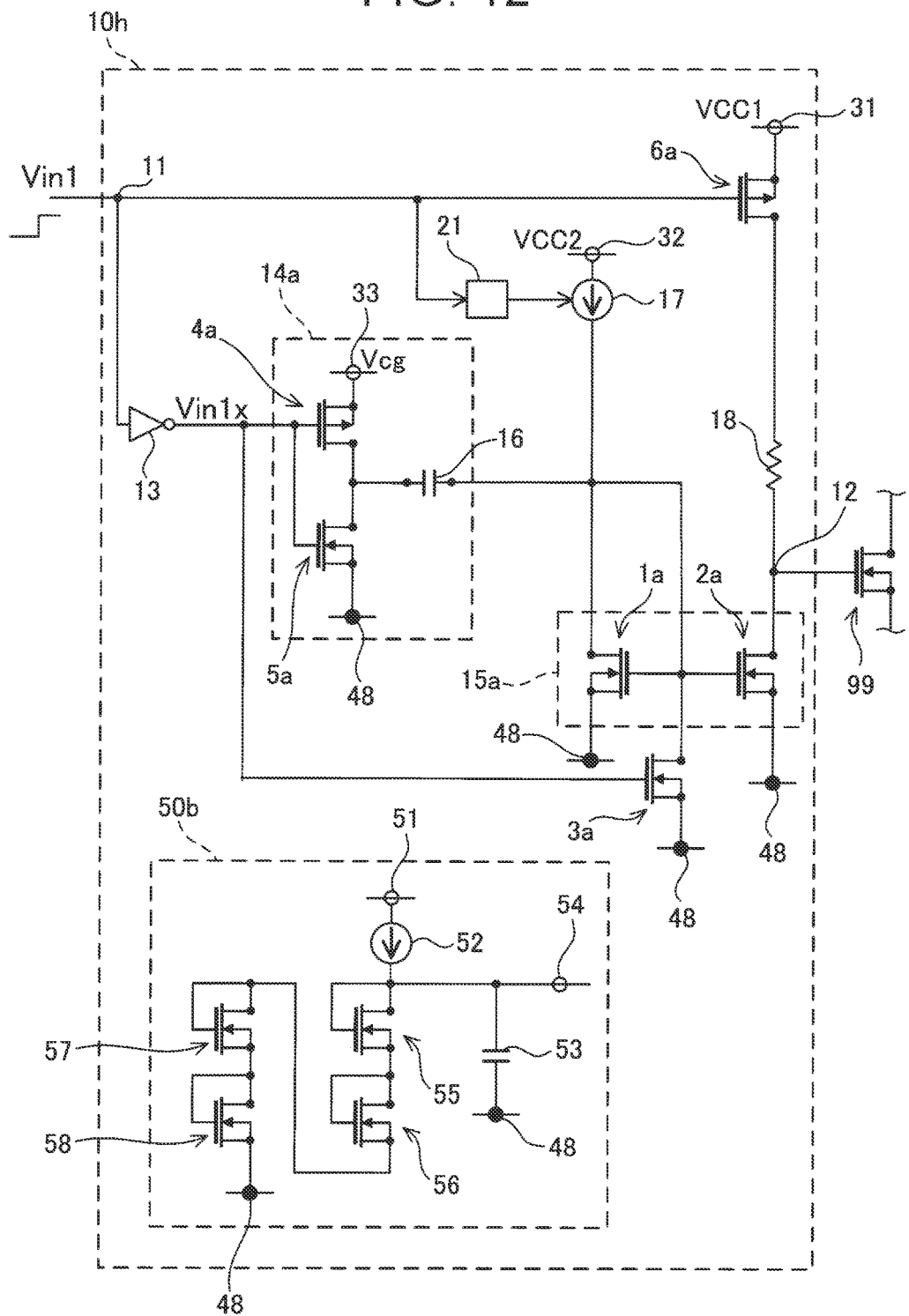
FIG. 12 is a block diagram of a drive unit of an eighth embodiment.

Referring to FIG. 12, a drive unit 10h of an eighth embodiment will be described. FIG. 12 is a block diagram of the drive unit 10h of the eighth embodiment. The drive unit 10h of the eighth embodiment is a modified example of the drive unit 10g (see FIG. 10) of the seventh embodiment. In the drive unit 10h, the devices other than a voltage adjustment circuit 50b are identical with those of the drive unit 10g of FIG. 10, and therefore, will not be described.

The drive unit 10h of the eighth embodiment includes the voltage adjustment circuit 50b. The voltage adjustment circuit 50a of the drive unit 10g of the previous embodiment includes the two transistors 55, 56 connected in series. The voltage adjustment circuit 50b of the drive unit 10h shown in FIG. 12 includes four transistors 55, 56, 57, 58 connected in series. The configuration of the voltage adjustment circuit 50b is identical with that of the voltage adjustment circuit 50a, except that the transistors 57, 58 are additionally provided. Transistors having the same characteristics as the first transistor 1a are employed as the transistors 55, 56, 57, 58. In the voltage adjustment circuit 50b the current source 52 has the same characteristics as the current source 17, and has the same current upper-limit value Idmax and the output terminal voltage Vref as the current source 17, as in the voltage adjustment circuit 50a of the previous embodiment. In the meantime, as the capacitor 16 of the gate charge circuit 14a, a capacitor whose capacitance Ccg is one third of the total capacitance Ccm of the gate capacitance of the first transistor 1a and the gate capacitance of the second transistor 2a is selected.

The relationship between the voltage Vcg of the power-supply positive terminal 33 of the gate charge circuit 14a, and the output terminal voltage Vref of the current source 17 will be described. The gate voltage Vcm provided by the voltage Vcg is expressed as Vcm=[Vcg×Ccg/(Ccg+Ccm)]. Since Ccg is equal to Ccm/4 (Ccg=Ccm/4), Vcg is equal to 4Vcm (Vcg=4Vcm). In the meantime, the transistors 55, 56, 57, 58 have the same characteristics as the first transistor 1a, and the same current flows through these transistors; therefore, $Vgs=V_{55}=V_{56}=V_{57}=V_{58}$. As in the case of the seventh embodiment, Vgs denotes the target ON voltage of the first transistor 1a. The target ON voltage is the gate voltage established when the first transistor 1.a is held in the ON state, and the output terminal voltage Vref of the current source 17 at the time when it delivers current of the current upper-limit value Idmax corresponds to the target ON voltage Vgs. From the above relationships, $Vcm=Vcg/4=(V_{55}+V_{56}+V_{57}+V_{58})/4=4Vgs/4=Vgs=Vref$. Namely, in the case of the eighth embodiment, too, the gate voltage Vcm of the first and second transistors 1a, 2a, when charged by the gate charge circuit 14a, reaches the output terminal voltage Vref of the current source 17, i.e., the target ON voltage. The operation of the drive unit 10h including the voltage adjustment circuit 50b is the same as that of the drive unit 10g of the seventh embodiment. The drive unit 10h of the eighth embodiment is different from the drive unit 10g of the seventh embodiment in that, in the drive unit 10h of the eighth embodiment, the capacitance of the capacitor of the gate charge circuit 14a can be reduced to one third of the total capacitance Ccm. This is realized by increasing the number of transistors of the voltage adjustment circuit 50b, and raising Vcg.

The following conclusion is derived from the above explanation concerning the eighth embodiment. Where "n" denotes the number of transistors connected in series between the current source 52 of the voltage adjustment circuit 50b and the common ground terminal 48, the capacitance Ccg of the capacitor 16 of the gate charge circuit 14a can be made equal to 1/n of the total capacitance Ccm.

Ninth Embodiment

Figure 13:
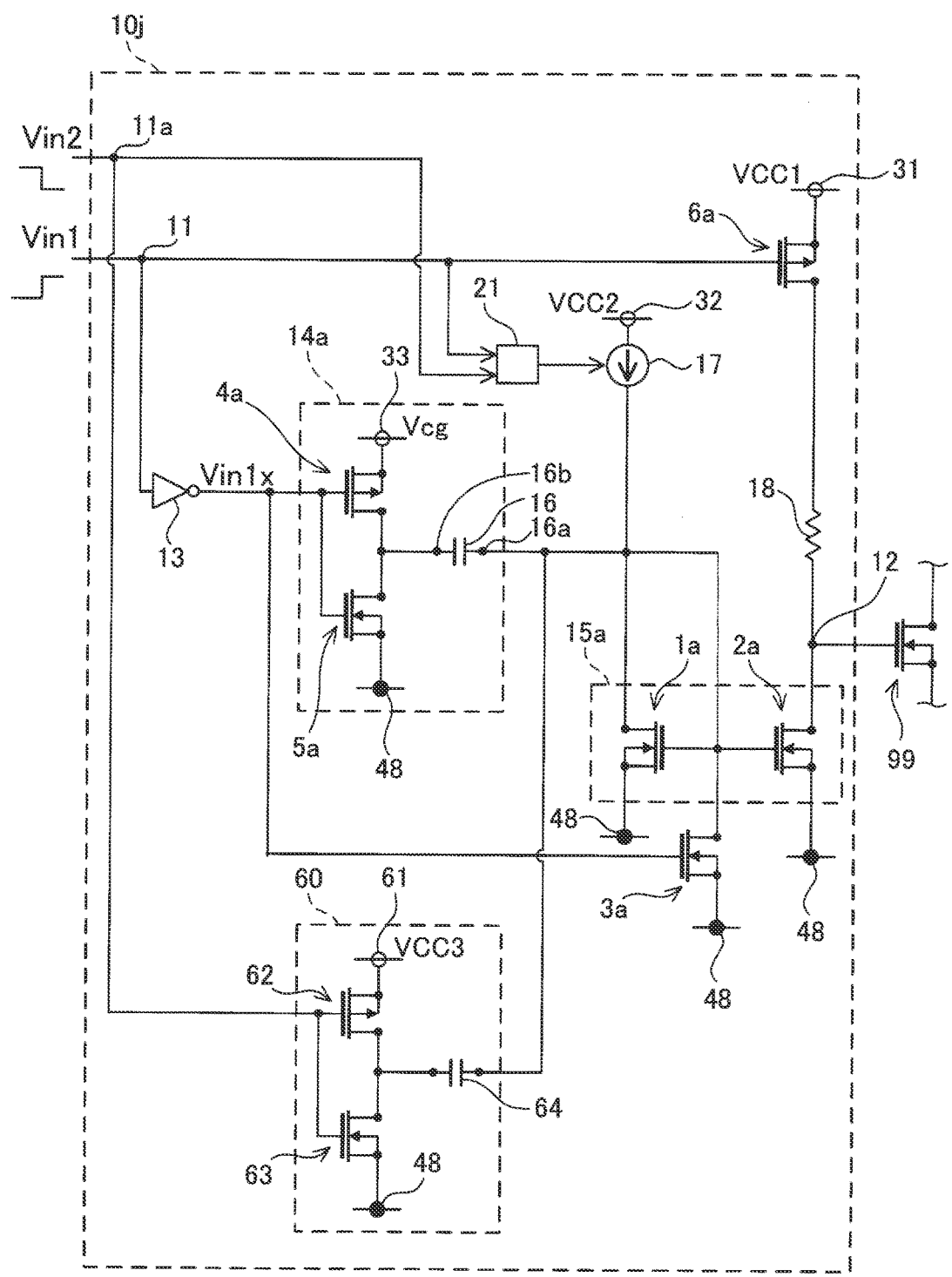
FIG. 13 is a block diagram of a drive unit of a ninth embodiment.
Figure 14:
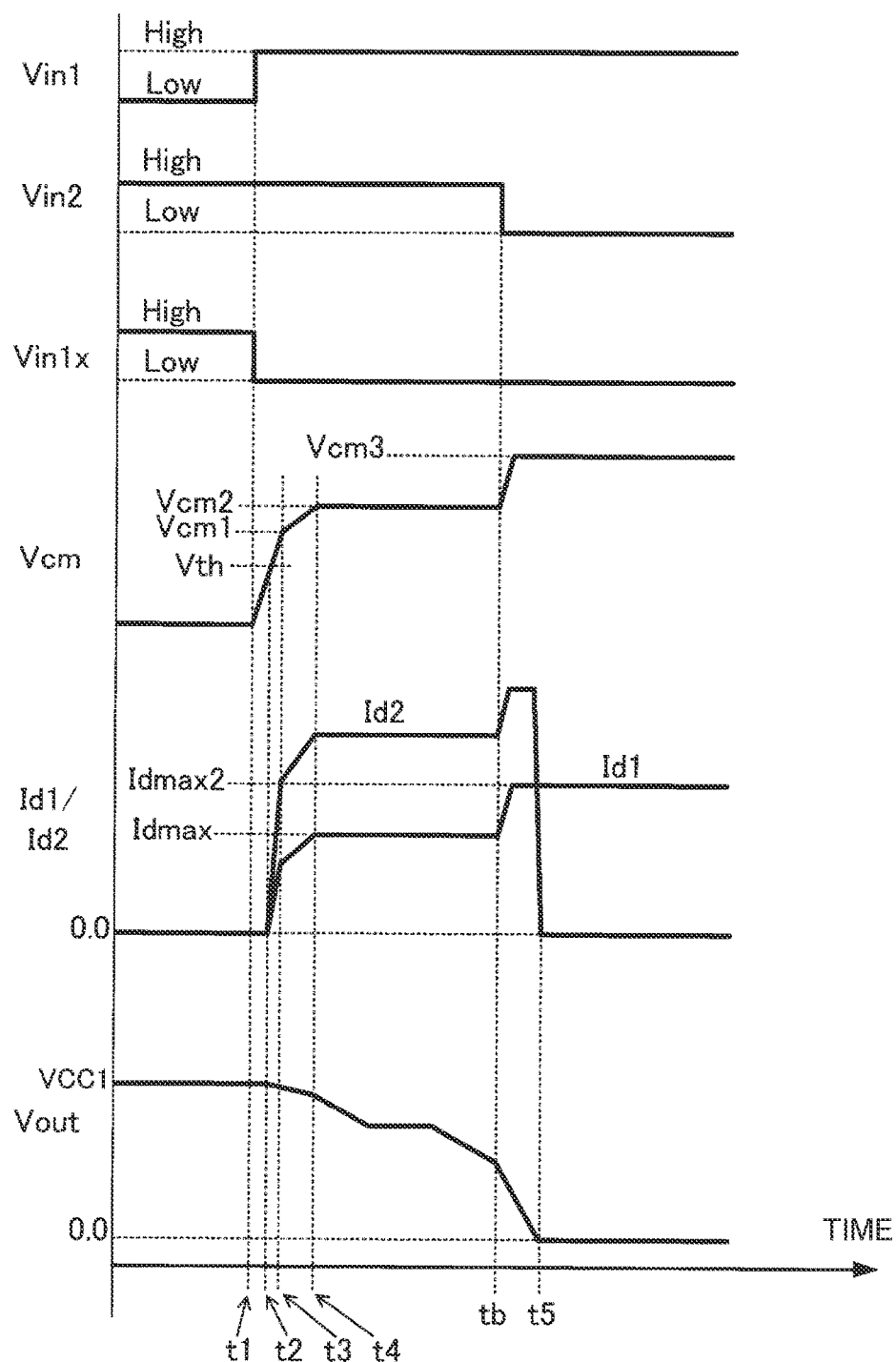
FIG. 14 is a time chart of the drive unit of the ninth embodiment.
Figure 15:
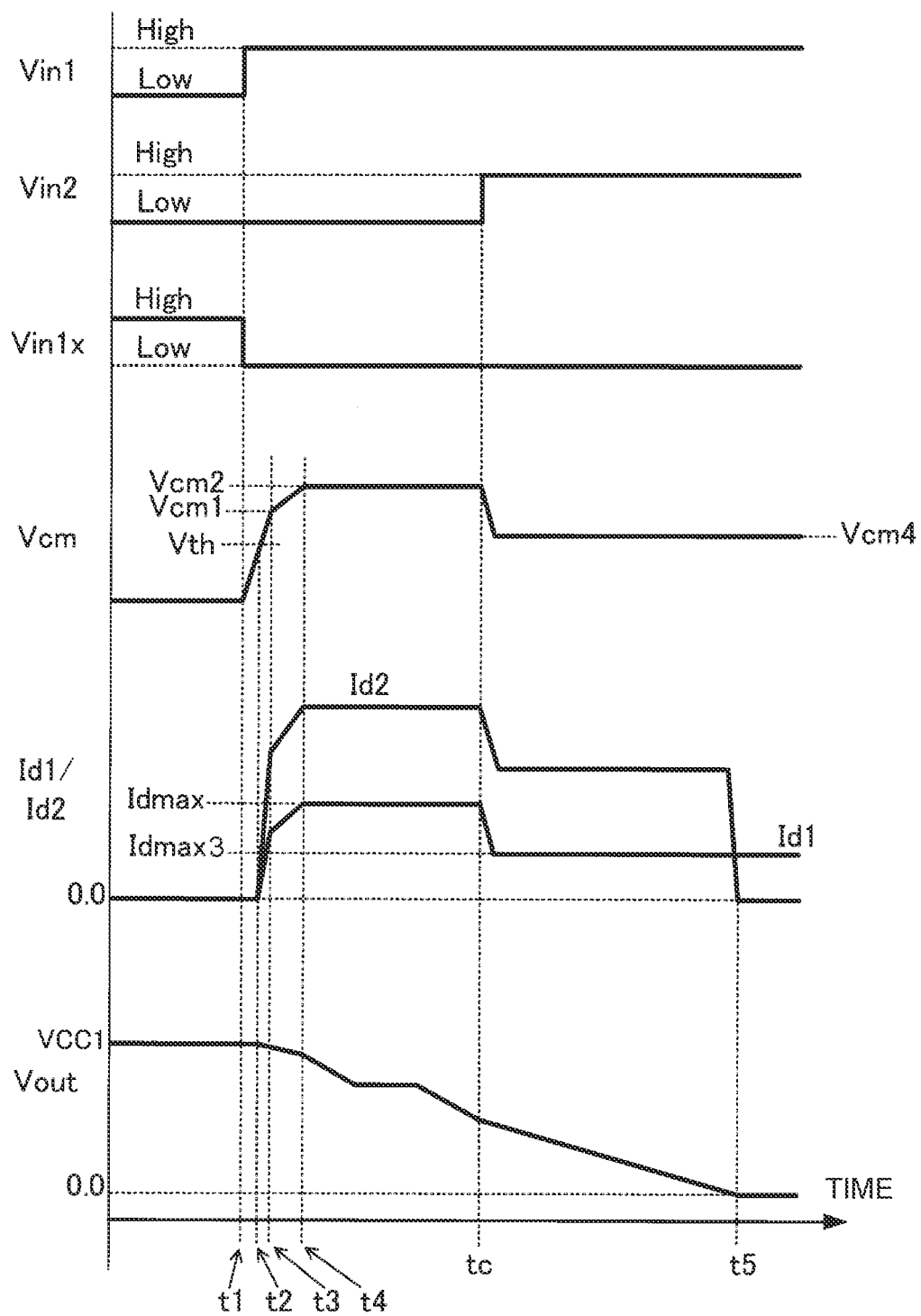
FIG. 15 is another time chart of the drive unit of the ninth embodiment.

Referring next to FIG. 13 to FIG. 15, a drive unit 10j of a ninth embodiment will be described. FIG. 13 is a block diagram of the drive unit 10j of the ninth embodiment. The drive unit 10j of the ninth embodiment includes a charge control circuit 60, in addition to the drive unit 10a of the first embodiment. The drive unit 10j changes the output current of the current source 17, during driving (ON/OFF switching) of the power transistor 99 to be driven. The charge control circuit 60 quickly adjusts the gate voltage of the first and second transistors 1a, 2a, according to change of the output current of the current source 17.

An output terminal of the charge control circuit 60 is connected to an output terminal of the gate charge circuit 14a (i.e., the electrode 16a of the capacitor 16). The charge control circuit 60 has the same structure as the gate charge circuit 14a. In the drive unit 10j of the ninth embodiment, too, the power-supply negative terminals 41, 42, 43, 49 in the drive unit 10a of the first embodiment are held at the same potential (the ground potential of the drive unit), and these terminals will be collectively called "common ground terminal 48".

The structure of the charge control circuit 60 will be described. The circuit structure of the charge control circuit 60 is identical with that of the gate charge circuit 14a. The charge control circuit 60 consists of a power-supply positive terminal 61 to which voltage VCC3 is supplied, common ground terminal 48, two transistors 62, 63, and a capacitor 64. The transistor 62 is a P-channel MOSFET, and the transistor 63 is an tri-channel MOSFET. The transistors 62, 63 are connected in series between the power-supply positive terminal 61 and the common ground terminal 48. More specifically, the source of the transistor 62 is connected to the power-supply positive terminal 61, and the drain is connected to the drain of the transistor 63. The source of the transistor 63 is connected to the common ground terminal 48. One electrode of the capacitor 64 is connected to one electrode 16a of the capacitor 16 of the gate charge circuit 14a. The other electrode of the capacitor 64 is connected to a middle point between the transistors 62, 63 connected in series.

The gates of the transistors 62, 63 are connected to a sub input terminal 11a. A pulsed current adjustment signal Vin2 is transmitted from a high-order control unit (not shown) to the sub input terminal 11a. The current adjustment signal Vin2 is transmitted to the current control circuit 21. The current control circuit 21 changes the magnitude (current upper-limit value) of the output current of the current source 17, in response to the current adjustment signal Vin2. The current source 17 can change the current (drain current) flowing between the drain and source of the first transistor 1a, from Idmax to Idmax2. The current values Idmax and Idmax2 will be called "current upper-limit value". The output terminal voltage of the current source 17 is Vref when the current source 17 limits the drain current to the current upper-limit value Idmax, and the output terminal voltage of the current source 17 is Vref2 when the drain current is limited to the current upper-limit value Idmax2. Here, the voltage Vref is lower than the voltage Vref2.

The gates of the transistors 62, 63 of the charge control circuit 40 are connected to the sub input terminal 11a, and the pulsed current adjustment signal Vin2 is also transmitted to the gates of the transistors 62, 63. When the current adjustment signal Vin2 is at a high level (High), the transistor 62 is held in the OFF state, and the transistor 63 is held in the ON state. As a result, the capacitor 64 is connected to the common ground terminal 48, and the capacitor 64 is placed in a discharged state. When the current adjustment signal Vin2 is at a low level (Low), the transistor 62 is held in the ON state, and the transistor 63 is held in the OFF state. As a result, the capacitor 64 is connected to the power-supply positive terminal 61, and the capacitor 64 is charged. While the capacitor 64 is shifting from the discharged state to the charged state, electric power is supplied from the capacitor 64 to the first transistor 1a of the current mirror circuit 15a.

The function of the charge, control circuit 60 will be described, using the time charts of FIG. 14 and FIG. 15. Initially, the time chart of FIG. 14 will be described. The time chart of FIG. 14 illustrates the case where the current upper-limit value set for the current source 17 is increased from Idmax to Idmax2. As described above, the output terminal voltage of the current source 17 is Vref when the current upper-limit value is Idmax, and the output terminal voltage increases to Vref2 when the current upper-limit value is Idmax2. The movements from time t1 to time, t4 are identical with those of the time chart shown in FIG. 2, and therefore, will not be described.

The current adjustment signal Vin2 as a signal for changing the current upper-limit value switches from a high level (High) to a low level (Low) at time tb. The current control circuit 21 raises the current upper-limit value of the current source 17 from Idmax to Idmax2, in response to the current adjustment signal Vin2. The magnitude of the drain current of the first transistor 1a is determined by the gate voltage of the first transistor 1a. If the output current of the current source 17 is changed, a part of the output current of the current source 17 (=current upper-limit value Idmax2) flows into the gate of the first transistor 1a, and raises the gate voltage. Since the gate of the first transistor 1a is connected with the gate of the second transistor 2a, the gates of both of the first and second transistors 1a, 2a are charged with a part of the output current of the current source 17 (=current upper-limit value Idmax2). If Idmax2 is small, the gate voltage rises only gradually, and the drain current of the first transistor 1a changes only gradually. The charge control circuit 60 quickly adjusts the gate voltage of the first and second transistors 1a, 2a when it increases the output current of the current source 17.

The current adjustment signal Vin2 is also transmitted to the charge control circuit 60. If the current adjustment signal Vin1 switches from the high level to the low level, the transistor 62 switches from OFF to ON, and the transistor 63 switches from ON to OFF, in the charge control circuit 60. Then, the destination to which the capacitor 64 is connected switches from the common ground terminal 48 to the power-supply positive terminal 61, and the capacitor 64 starts being charged. Until the capacitor 64 is fully charged, electric power is supplied from the power-supply positive terminal 61 to the gates of the first and second transistors 1a, 2a via the capacitor 64. Therefore, immediately after time tb, the gate voltage Vcm of the first and second transistors 1a, 2a is rapidly raised from Vcm2 to Vcm3. As the gate voltage Vcm increases, the drain current Id1 of the first transistor 1a quickly increases from Idmax to Idmax2. Since the drain current Id1 of the first transistor 1a increases, the current becomes more likely to flow through the second transistor 2a that before, and the voltage of the drain of the second transistor 2a, namely, the voltage Vout of the output terminal 12, is reduced at an increased rate or more rapidly. Thus, time t5 at which the voltage Vout of the output terminal 12 reaches zero becomes earlier than that in the case of the time chart of FIG. 2. In FIG. 14, Vcm2 corresponds to the output terminal voltage Vref at the time when the current source 17 delivers current of the current upper-limit value Idmax as the drain current of the first transistor 1a. Also, Vcm3 corresponds to the output terminal voltage Vref2 (>Vref) at the time when the current source 17 delivers current of the current upper-limit value Idmax2 (>Idmax) as the drain current.

The time chart of FIG. 15 will be described. The time chart of FIG. 15 illustrates the case where the current control circuit 21 reduces the current upper-limit value of the current source 17 from Idmax to Idmax3. The output terminal voltage of the current source 17 is Vref when the current upper-limit value is Idmax, and the output terminal voltage is reduced to Vref3 when the current upper-limit value is Idmax3. The movements from time t1 to time t4 are identical with those of the time chart shown in FIG. 2, and therefore, will not be described.

The current adjustment signal Vin2 as a signal for changing the current upper-limit value switches from a low level (Low) to a high level (High) at time tc. The current control circuit 21 reduces the current upper-limit value of the current source 17 from Idmax to Idmax3, in response to the current adjustment signal Vin2. If the current adjustment signal Vin2 switches from the low level to the high level, the transistor 62 switches from ON to OFF, and the transistor 63 switches from OFF to ON, in the charge control circuit 60. Then, the destination to which the capacitor 64 is connected switches from the power-supply positive terminal 61 to the common ground terminal 48, and a certain amount of electric power is discharged from the gates of the first and second transistors 1a, 2a via the common ground terminal 48. Therefore, immediately after time tc, the gate voltage Vcm of the first and second transistors 1a, 2a is rapidly reduced from Vcm2 to Vcm4. In FIG. 15, Vcm2 corresponds to the output terminal voltage Vref at the time when the current source 17 delivers current of the current upper-limit value Idmax, and Vcm3 corresponds to the output terminal voltage Vref3 (<Vref) at the time when the current source 17 delivers current of the current upper lima value Idmax3 (<Idmax).

As the gate voltage Vcm is rapidly reduced, the drain current Id1 of the first transistor 1a is quickly reduced from Idmax to Idmax3. Since the drain current Id1 of the first transistor 1a is reduced, the drain current Id2 of the second transistor 2b is also reduced, and the voltage of the drain of the second transistor 2a, namely, the voltage Vout of the output terminal 12, is reduced at a reduced rate of more slowly. Thus, time t5 which the voltage gout of the output terminal 12 reaches zero becomes later than that in the case of the time chart of FIG. 2.

In the time chart of FIG. 14, when the current adjustment signal Vin2 is received at time tb, the gate voltage Vcm changes quickly, and the drain current Id1 quickly changes from Idmax to Idmax2. Then, the drain current Id2 of the second transistor 2a also changes quickly. In the time chart of FIG. 15, when the current adjustment signal Vin2 is received at time tc, the gate voltage Vcm changes quickly, and the drain current Id1 quickly changes from Idmax to Idmax3. Then, the drain current Id2 of the second transistor 2a also changes quickly. In the drive unit 10j of the ninth embodiment, the gate voltage of the first transistor 1a of the current mirror circuit 15a can be changed quickly, and the drain currents Id1, Id2 of the first and second transistors 1a, 2a can be changed quickly. The charge control circuit 60 in the drive unit 10j of the ninth embodiment is an application of the technology of the gate charge circuit 14a.

Tenth Embodiment

Figure 16:
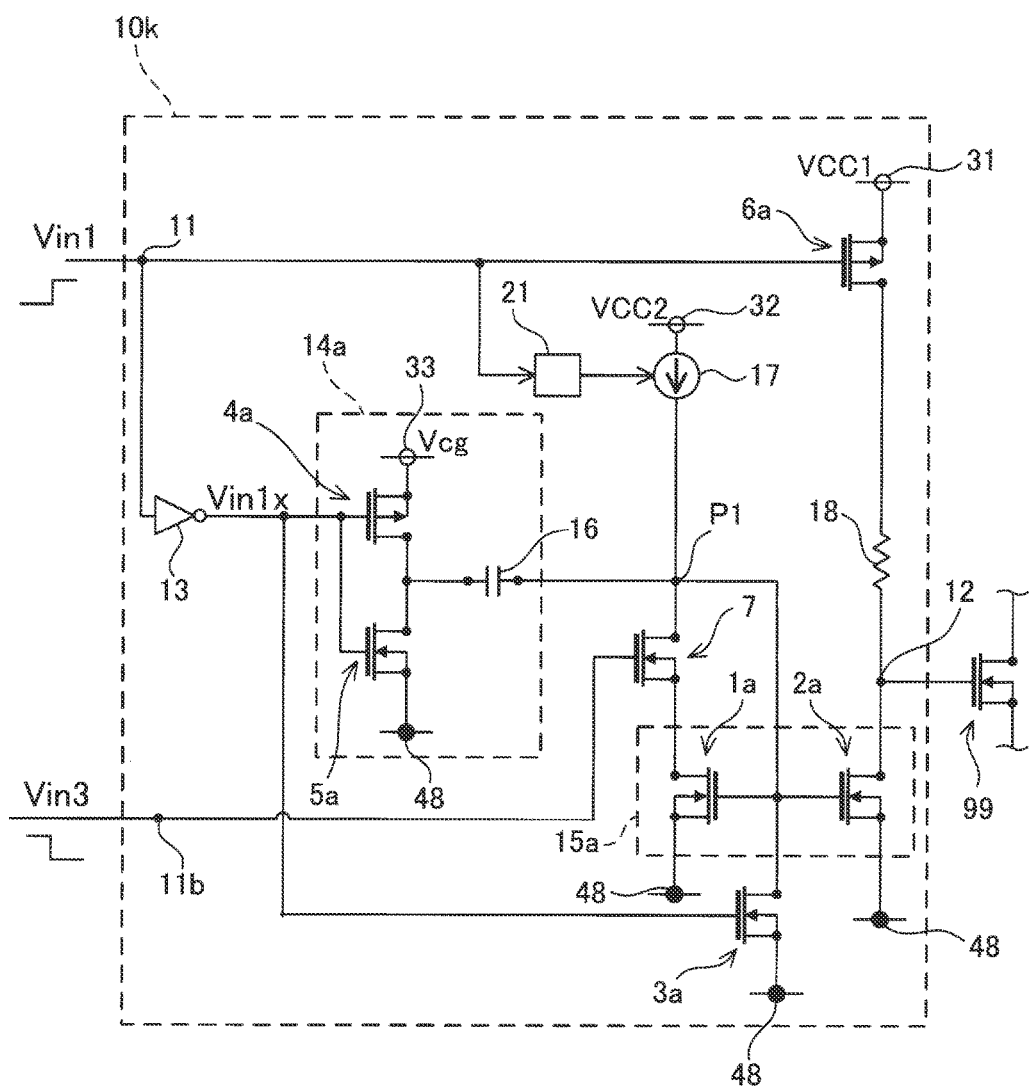
FIG. 16 is a block diagram of a drive unit of a tenth embodiment.
Figure 17:
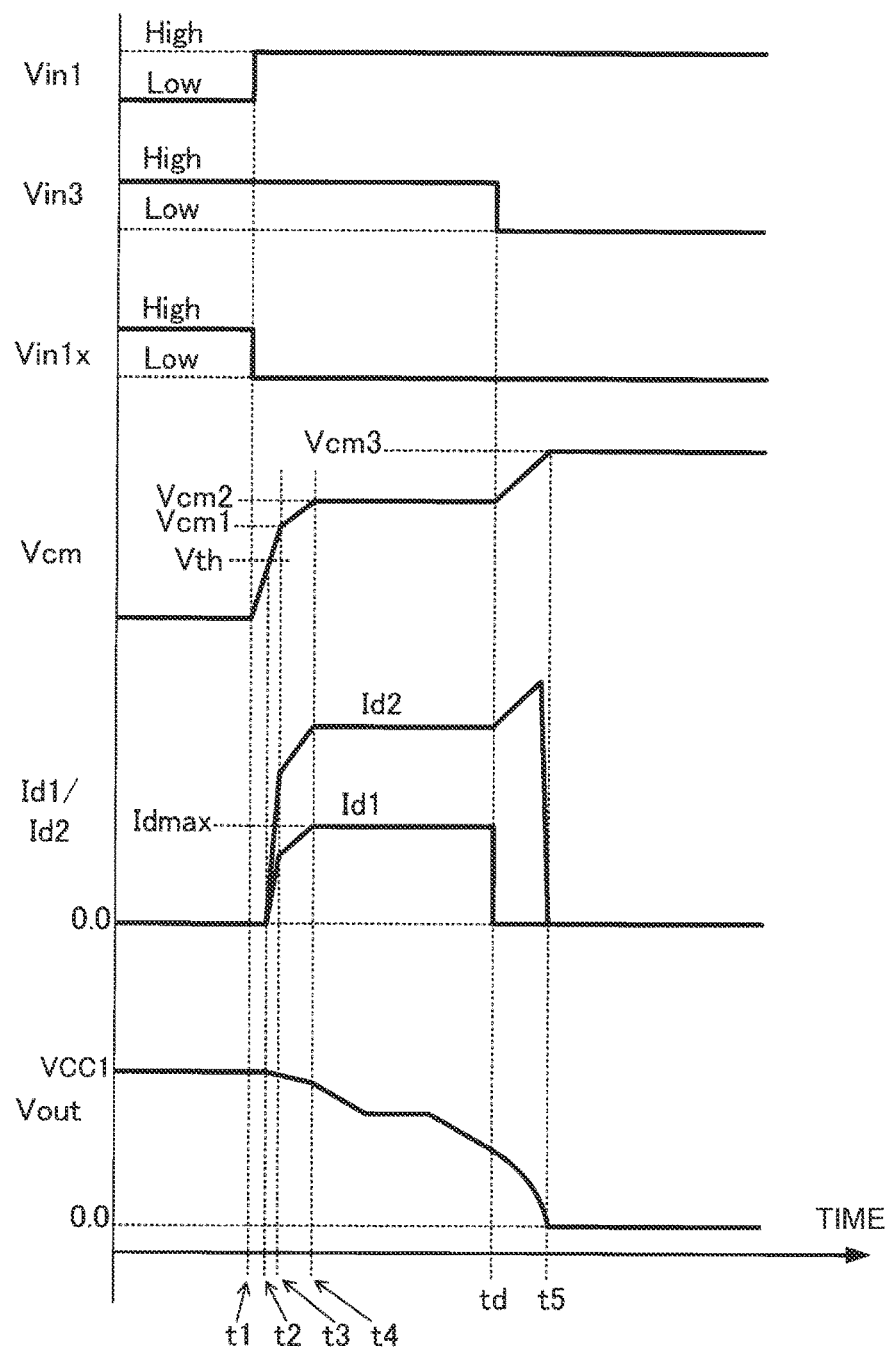
FIG. 17 is a time chart of the drive unit of the tenth embodiment.

Referring to FIG. 16 and FIG. 17, a drive unit 10k of a tenth embodiment will be described. FIG. 16 is a block diagram of the drive unit 10k. FIG. 17 is a time chart of operation of the drive unit 10k. The drive unit 10k includes a sub input terminal 11b and a seventh transistor 7, in addition to the drive unit 10a of the first embodiment. The seventh transistor 7 functions as a switch (cutoff switch) that cuts off current (main current) flowing between the drain and source of the first transistor 1a after the first and second transistors 1a, 2a switch from OFF to ON. The configuration of the drive unit 10k other than the sub input terminal 11b and the seventh transistor 7 is identical with that of the drive unit 10a of FIG. 1, and the movements up to time t4 of FIG. 17 are identical with those of the time chart of FIG. 2, and therefore, will not be described.

The sub input terminal 11b receives a command signal (cutoff command signal Vin3) for disconnecting the first transistor 1a from the circuit, from a high-order control unit (not shown). The cutoff command signal Vin3 is also a pulsed signal, and is held at a high level (High) at first. A falling edge at which the signal switches from the high level to the high level corresponds to a command to shut off the first transistor 1a.

The seventh transistor 7 is connected between the first transistor 1a and a connection point P1. At the connection point P1, the high-potential-side electrode and gate of the first transistor 1a are connected with the capacitor 16. The gate of the seventh transistor 7 is connected to the sub input terminal 11b. The seventh transistor 7, which is an N-channel MOSFET, is in the ON state while the gate voltage is held at a high potential, and is turned off when the gate voltage is reduced to a low potential. As described above, the cutoff command signal Vin3 is held at the high level at first, and the seventh transistor 7 is held in the ON state. While the seventh transistor 7 is in the ON state, the drive unit 10k operates in the same manner as the drive unit 10a of the first embodiment.

Referring to the time chart of FIG. 17, the function of the seventh transistor 7 and the operation of the drive unit 10k will be described. The cutoff command signal Vin3 switches from the high level (High) to the low level (Low) at time td. Before time td, the first and second transistors 1a, 2a of the current mirror circuit 15a of the drive unit 10k switch from OFF to ON at time t2. At time t4, the drain current Id1 of the first transistor 1a reaches the current upper-limit value Idmax. In the drive unit 10a of FIG. 1, after time t4, a constant current (current upper-limit value Idmax) keeps flowing as the drain current Id1 of the first transistor 1a (see FIG. 2). In the drive unit 10k of the tenth embodiment, the cutoff command signal Vin3 switches from the high level to the low level, at time td that is later than time t4. The seventh transistor 7 switches from ON to OFF at time td, in response to the cutoff command signal Vin3. If the seventh transistor 7 is turned OFF, the drain (high-potential-side electrode) of the first transistor 1a is brought into a cutoff state. Namely, after time td, the drain current Id1 of the first transistor 1a becomes equal to zero. It is, however, to be noted that the current source 17 is kept connected to the gates of the first and second transistors 1a, 2a, as shown in FIG. 16. If the drain of the first transistor 1a is cut off, the current of the current source 17 flows into the gates of the first and second transistors 1a, 2a, and the gate voltage Vcm increases. Since the gate voltage Vcm increases, the drain current Id2 of the second transistor 2a increases. As a result, the rate of reduction of the output terminal voltage Vout is increased, and the output terminal voltage Vout becomes equal to zero at an earlier point in time, as compared with that in the time chart of FIG. 2.

In the drive unit 10k of the tenth embodiment, the drain current of the first transistor 1a becomes equal to zero after time td; therefore, the electric power consumption can be suppressed or reduced to be smaller than that of the drive unit 10a of the first embodiment.

In the drive unit 10k of the tenth embodiment, the seventh transistor 7 is connected to the drain side of the first transistor 1a. The seventh transistor 7 may be connected to the source (low-potential-side electrode) side of the first transistor 1a. The seventh transistor 7 functions as a switch (cutoff switch) for cutting off current (main current) flowing between the drain and source of the first transistor 1a, after the first and second transistors 1a, 2a switch from OFF to ON. The cutoff switch may be provided by a device other than the transistor. For example, the cutoff switch may be provided by an electromagnetic relay.

Eleventh Embodiment

Figure 18:
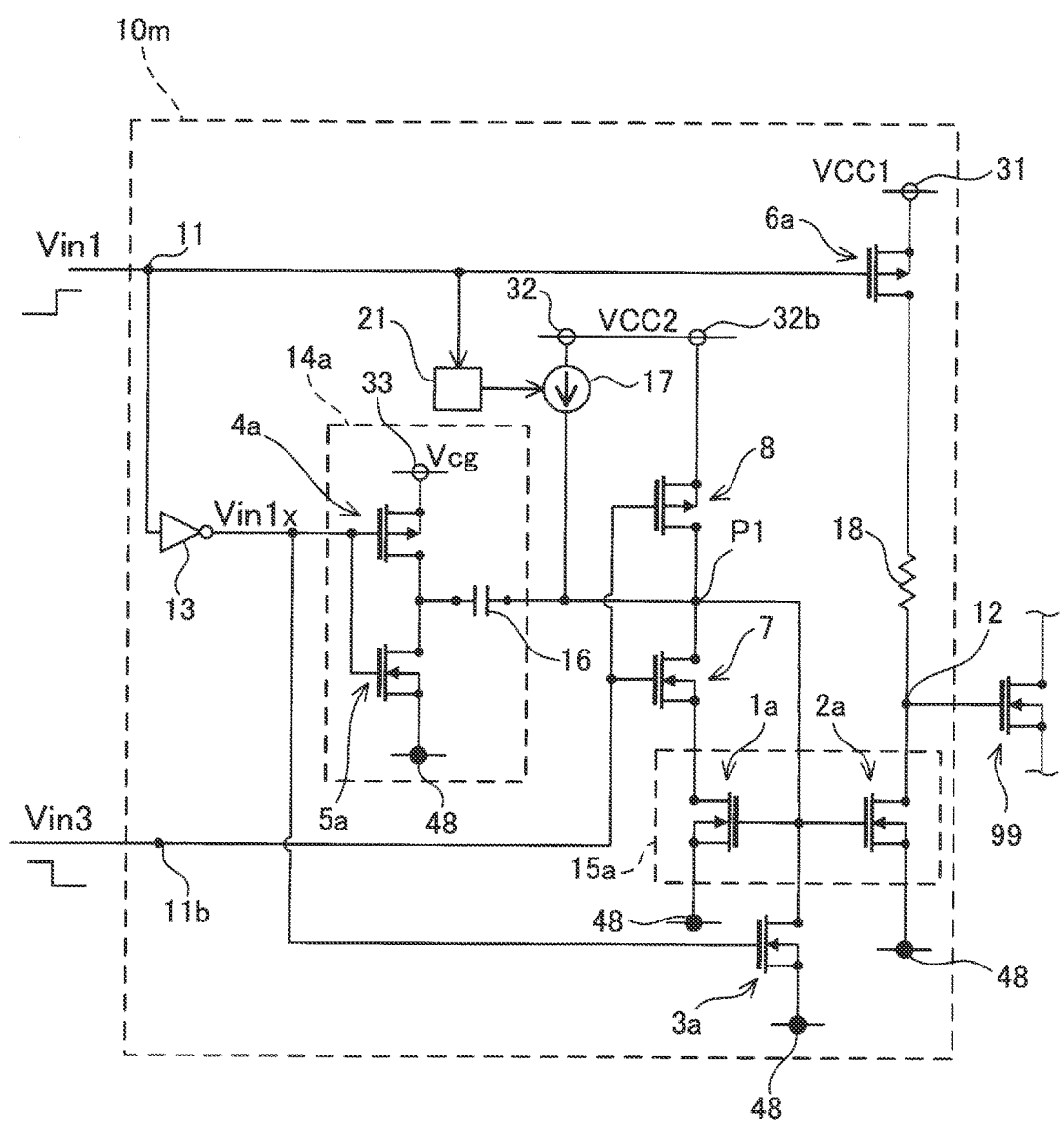
FIG. 18 is a block diagram of a drive unit of an eleventh embodiment.

Referring next to FIG. 18 and FIG. 19, a drive unit 10m of an eleventh embodiment will be described. FIG. 18 is a block diagram of the drive unit 10m. FIG. 19 is a time chart of operation of the drive unit 10m. The drive unit 10m includes an eighth transistor 8, in addition to the drive unit 10k of the previous embodiment. The eighth transistor 8 is connected between the connection point P1 and a power-supply positive terminal 32b. The power-supply positive terminal 32b is held at the same voltage VCC2 as that of the power-supply positive terminal 32 connected to the input terminal of the current source 17. The eighth transistor 8, which is a P-channel transistor, is OFF when the gate voltage is at a high level (High), and is ON when the gate voltage is at a low level (Low). Also, the gate of the eighth transistor 8 is connected to the sub input terminal 11b. As in the case of the tenth embodiment, the cutoff command signal Vin3 that is normally held at a high level (High) is transmitted to the sub input terminal 11b. While the cutoff command signal Vin3 is held at the high level, the eighth transistor 8 disconnects the power-supply positive terminal 32b from the connection point P1. When the cutoff command signal Vin3 switches to the low level, electric current is allowed to flow between the power-supply positive terminal 32b and the connection point P1.

Referring to the time chart of FIG. 19, operation of the drive unit 10m will be described. Prior to time t4, the operation shown in the time chart of FIG. 19 is identical with that of the time chart of FIG. 2. Like the drive unit 10k of the previous embodiment, the drive unit 10m receives a cutoff command signal Vin3 that switches from a high level (High) to a low level (Low) at time td. With the cutoff command signal Vin3 thus received, the seventh transistor 7 is turned off, and the eighth transistor 8 is turned on. With the seventh transistor 7 thus turned off, the drain current Id1 of the first transistor 1a becomes equal to zero. With the eighth transistor 8 thus turned on, electric power is supplied from both of the current source 17 and the power-supply positive terminal 32b to the gates of the first and second transistors 1a, 2a. After time td, electric current supplied to the first and second transistors 1a, 2a is increased, as compared with the case of the drive unit 10k of the previous embodiment. Therefore, the rate of increase of the gate voltage Vcm after time td is increased, as compared with the case of the drive unit 10k. As a result, the rate of increase of the drain current Id2 of the second transistor 2a is increased, and the output terminal voltage Vout reaches zero at an even earlier paint in time.

Like the drive unit 10k of the tenth embodiment, the drive unit 10m of the eleventh embodiment includes the seventh transistor 7 as a cutoff switch, whereby electric power consumption of the first transistor 1a can be further reduced. The drive unit 10m of the eleventh embodiment includes the eighth transistor 8, whereby the output terminal voltage Vout can be reduced to zero more quickly or at a further increased rate.

The seventh transistor 7 (cutoff switch) of the tenth embodiment, and the eighth transistor 8 of the eleventh embodiment, may be used in the drive units of the second embodiment through the ninth embodiment.

A point to note in connection with the above embodiments will be described. In the first to third embodiments and the seventh to eleventh embodiments in which the current source is located on the high potential side of the first transistor 1a, the current control circuit 21 controls the current source 17. Namely, the current control circuit 21 controls start of charging of the gate of the first transistor 1a using the current source 17. The function of the current control circuit 21 may be incorporated in the current source 17. Also, the current control circuit 21 may not be provided. In this case, the current control circuit 21 is replaced by the third transistor 3a, and the NOT device 13 that supplies the inversion signal Vin1x of the drive signal Vin1 to the gate of the third transistor 3a. This replacement will be explained with regard to the case of the first embodiment of FIG. 1. Suppose the current control circuit 21 is removed from the drive unit 10a, and the current source 17 delivers constant current at all times. While the drive signal Vin1 is held at a low level (Low), a signal of a high level (High) is supplied to the gate of the third transistor 3a, and the third transistor 3a is held in the ON state. At this time, the gates of the first and second transistors 1a, 2a are connected to the power-supply negative terminal 49, and are held at the potential of the power-supply negative terminal 49. Namely, the gates of the first and second transistors 1a, 2a are held at the low potential. Even if the current source 17 keeps supplying constant current, the current flows into the power-supply negative terminal 49 via the third transistor 3a, and the gates of the first and second transistors 1a, 2a are not charged. If the drive signal Vin1 switches from the low level to the high level, the third transistor 3a is turned off, and the gates of the first and second transistors 1a, 2a are disconnected from the power-supply negative terminal 49. Since constant current is supplied from the current source 17 at all times, the gates of the first and second transistors 1a, 2a start being charged with the current source 17 when the third transistor 3a is turned off. As described above, when the current control circuit 21 is removed from the drive unit 10a, the third transistor 3a and the NOT device 13 correspond to the current control circuit that starts charging the gates of the first and second transistors 1a, 2a using the current source 17. It is, however, to be noted that the current control circuit 21 that switches the current source 17 from the output stopped state to the output state in response to the drive signal Vin1 is advantageous in that the output current of the current source 17 is not wasted while the first transistor 1a is in the OFF state.

In the fourth to sixth embodiments, the current control circuit 22 may be incorporated in the current source 27.

In the illustrated embodiments, the MOSFETs are employed in the current mirror circuit. The transistors employed in the current mirror circuit are not limited to the MOSFETs, provided that they are of voltage driven type. The transistors employed in the current mirror circuit may be IGBTs.

According to the technology disclosed in this specification, transistors other than the transistors used in the current mirror circuit are not limited to any particular type. Also, the first transistor and the second transistor may be devices that are individually packaged, or may be formed on a single substrate. The first transistor and the second transistor may be two transistors mounted in one chip.

In the drive units of the first to third embodiments and the seventh to eleventh embodiments, the voltage-driven type N-channel first and second transistors 1a, 2a are employed in the current mirror circuit. The current control circuit 21 of the embodiments function as one example of "current control circuit" and the current source 17 functions as one example of "current source". The gate charge circuit 14a of the embodiments functions as one example of "first charge circuit". The power-supply positive terminal 33 functions as one example of "charge terminal", and the power-supply negative terminal 43 and the common ground terminal 48 function as "discharge terminals". The fourth and fifth transistors 4a, 5a of the gate charge circuit 14a function as "charge switch" of the first charge circuit. The "charge switch" of the first charge circuit is not limited to the fourth and fifth transistors 4a, 5a, provided that it is a switch circuit that switches the destination to which the electrode 16b of the capacitor 16 is connected, from the discharge terminal (the power-supply negative terminal 43 or the common ground terminal 48) to the charge terminal (the power-supply positive terminal 33), in response to the drive signal Vin1.

The gate charge circuit 14b of the third embodiment functions as one example of "second charge circuit". The fourth transistor 104a of the gate charge circuit 14b functions as one example of "charge switch" of the second charge circuit. The "charge switch" of the second charge circuit is not limited to the fourth transistor 104a, provided that it provides a switch circuit that switches the connecting state between the charge terminal (power-supply positive terminal 32) and the first and second transistors 1a, 2a from the cutoff state to the conducting state, in response to the drive signal Vin1.

In the drive units of the fourth to sixth embodiments, the voltage-driven type P-channel first and second transistors 1b, 2b are employed in the current mirror circuit. The current control circuit 22 of the embodiments functions as one example of "current control circuit", and the current source 27 functions as one example of "current source". The gate discharge circuit 24a of the embodiments functions as one example of "first discharge circuit". The power-supply positive terminal 33 functions as one example of "charge terminal", and the power-supply negative terminal 43 functions as one example of "discharge terminal". The fourth and fifth transistors 4b, 5b of the gate discharge circuit 24a function as one example of "discharge switch" of the first discharge circuit. The "discharge switch" of the first discharge circuit is not limited to the fourth and fifth transistors 4b, 5b provided that it is a switch circuit that switches the destination to which the electrode 26b of the capacitor 26 is connected, from the charge terminal (power-supply positive terminal 33) to the discharge terminal (power-supply negative terminal 43), in response to the drive signal Vin1. The power-supply positive terminal 39 of the embodiments functions as one example of "electric power supply terminal".

The gate discharge circuit 24b of the sixth embodiment functions as one example of "second discharge circuit". The fourth transistor 104b of the gate discharge circuit 24b functions as one example of "discharge switch" of the second discharge circuit. The "discharge switch" of the second discharge circuit is not limited to the fourth transistor 104b provided that it provides a switch circuit that switches the connecting state between the discharge terminal (power-supply negative terminal 42) and the first and second transistors 1b, 2b, from the cutoff state to the conducting state, in response to the drive signal Vin1.

The phrase "in response to the drive signal" in the description of the embodiments means "in response to a trigger that dictates switching of the power transistor between ON and OFF". A specific example of "in response to the drive signal" is "in response to a pulse edge of the drive signal which switches the power transistor between ON and OFF".

In the drive units of the illustrated embodiments, a switch circuit using a current mirror circuit is disposed in one of a part of the drive unit between the output terminal 12 and the power-supply positive terminal 31, and a part of the drive unit between the output terminal 12 and the power-supply negative terminal 41, and a switch circuit that consists of one transistor (sixth transistor) is disposed in the other of the above parts of the drive unit. A switch circuit using a current mirror circuit may be disposed in each of the part of the drive unit between the output terminal 12 and the power-supply positive terminal 31, and the part of the drive unit between the output terminal 12 and the power-supply negative terminal 41.

While specific examples have been described in detail, these examples are merely exemplary, and are not supposed to limit the appended claims. The technologies described in the claims include those into which the illustrated specific examples are modified or changed in various manners. Technical elements described in this specification or drawings may be used alone or in various combinations, to exhibit technical usefulness, and are not limited to the combinations described in the claims at the time of filing. Also, the technologies illustrated in this specification or drawings can achieve two or more objects at the same time, and provide technical usefulness by achieving at least one of these objects.

What is claimed is:

1. A drive unit that drives a transistor to be driven, based on a drive signal, the drive unit comprising:
   a first transistor that is a voltage-driven type P-channel transistor, and has a low-potential-side electrode and a gate connected to each other;
   a second transistor that is a voltage-driven type P-channel transistor, and has the same gate threshold voltage as the first transistor, the second transistor having a gate connected to the gate of the first transistor, and a high-potential-side electrode and a low-potential-side electrode to one of which a gate of the transistor to be driven is connected;
   a current source connected to the low-potential-side electrode of the first transistor, the current source being adapted to allow constant current to pass therethrough;
   a current control circuit configured to control start of discharging of the gates of the first transistor and the second transistor using the current source, in response to the drive signal; and
   a gate discharge circuit that discharges the gates of the first transistor and the second transistor, separately from the current source, wherein:
   the gate discharge circuit includes configuration of a first discharge circuit;
   the first discharge circuit includes
      a capacitor having one electrode connected to the gates of the first transistor and the second transistor,
      a charge terminal that supplies electric power to another electrode of the capacitor,
      a discharge terminal that discharges electric power from the other electrode of the capacitor, and
      a charge switch configured to switch a destination to which the other electrode of the capacitor is connected, from the charge terminal to the discharge terminal, in response to the drive signal;
   the first discharge circuit satisfies a relationship of $dVcg \cdot Ccm/(Ccg+Ccm) \geq VLref$, where $VLref$ is an input terminal voltage of the current source when the constant current flows between the high-potential-side electrode and the low-potential-side electrode of the first transistor, $Ccg$ is a capacitance of the capacitor, $Ccm$ is a total capacitance of gate capacitances of the first transistor and the second transistor, and $dVcg$ is a voltage difference between an electric power supply terminal that supplies electric power to the gates of the first transistor and the second transistor, and the discharge terminal.

2. The drive unit according to claim 1, wherein the gate discharge circuit is the first discharge circuit, and satisfies a relationship of $Vth \geq dVcg \cdot Ccm/(Ccg+Ccm)$, where $Ccg$ is the capacitance, Ccm is the total capacitance, dVcg is the voltage difference, and Vth is a gate threshold voltage of the first transistor and the second transistor.

3. The drive unit according to claim 1, further comprising a cutoff switch configured to cut off current flowing between the high-potential-side electrode and the low-potential-side electrode of the first transistor after the first transistor and the second transistor switch from OFF to ON.

4. The drive unit according to claim 3, wherein the cutoff switch has a drain connected to a power-supply negative terminal of the drive unit, and a source connected to an output terminal of the drive unit via a resistor.

* * * * *

UNITED STATES PATENT AND TRADEMARK OFFICE
CERTIFICATE OF CORRECTION

PATENT NO. : 10,110,222 B2
APPLICATION NO. : 15/992542
DATED : October 23, 2018
INVENTOR(S) : Yosuke Osanai It is certified that error appears in the above-identified patent and that said Letters Patent is hereby corrected as shown below:

In the Specification

In Column 17, Line 15, delete "$[V_{cg}.V_{cg}/(C_{cg}+C_{cm})]$" and insert --$[V_{cg}.C_{cg}/(C_{cg}+C_{cm})]$--, therefor.

In Column 24, Line 06, after "low level", delete "(Lou)" and insert --(Low)--, therefor.

In Column 32, Line 43, delete "$V_{gs}=V_{55}\ V_{56}$" and insert --$V_{gs}=V_{55}=V_{56}$--, therefor.

In Column 35, Line 04, delete "tri-channel" and insert --N-channel--, therefor.

Signed and Sealed this
Eleventh Day of December, 2018

Andrei Iancu
*Director of the United States Patent and Trademark Office*